US007292124B2

(12) United States Patent
Kawai et al.

(10) Patent No.: US 7,292,124 B2
(45) Date of Patent: Nov. 6, 2007

(54) VARIABLE RESONATOR AND VARIABLE PHASE SHIFTER

(75) Inventors: Kunihiro Kawai, Yokohama (JP); Daisuke Koizumi, Zushi (JP); Hiroshi Okazaki, Yokosuka (JP); Shoichi Narahashi, Yokohama (JP); Yasushi Yamao, Yokosuka (JP)

(73) Assignee: NTT DoCoMo, Inc., Tokyo (JP)

(*) Notice: Subject to any disclaimer, the term of this patent is extended or adjusted under 35 U.S.C. 154(b) by 0 days.

(21) Appl. No.: 11/046,944

(22) Filed: Feb. 1, 2005

(65) Prior Publication Data

US 2005/0190018 A1 Sep. 1, 2005

(30) Foreign Application Priority Data

Feb. 3, 2004 (JP) ............................ 2004-027221

(51) Int. Cl.
*H01P 7/08* (2006.01)
*H01P 3/08* (2006.01)
*H03H 7/18* (2006.01)

(52) U.S. Cl. .................... 333/219; 333/22 R; 333/140; 333/161; 333/164

(58) Field of Classification Search .................. 333/22, 333/140, 161, 164, 219
See application file for complete search history.

(56) References Cited

U.S. PATENT DOCUMENTS 5,808,527 A * 9/1998 De Los Santos ............ 333/205
6,043,727 A 3/2000 Warneke et al.
6,452,465 B1 9/2002 Brown et al.
6,525,627 B2 * 2/2003 Nakada ...................... 333/161
6,876,056 B2 * 4/2005 Tilmans et al. ............ 333/205

FOREIGN PATENT DOCUMENTS

EP 0 520 641 A1 12/1992
EP 0 849 820 A2 6/1998
JP 6-61092 3/1994
JP 6-216602 8/1994

OTHER PUBLICATIONS

"The Lecture of Practicable Microwave Technology", vol. 3. Published Jun. 2001.
U.S. Appl. No. 11/555,437, filed Nov. 1, 2006, Kawai et al.

* cited by examiner

*Primary Examiner*—Robert Pascal
*Assistant Examiner*—Kimberly E Glenn
(74) *Attorney, Agent, or Firm*—Oblon, Spivak, McCellland, Maier & Neustadt, P.C.

(57) ABSTRACT

A variable resonator is provided which comprises signal conductor 13 formed on top side surface of dielectric substrate 12, ground conductor layer 11 formed on back side surface thereof and switches 14, wherein signal conductor comprises a plurality of first conductor lines 13-1 and second conductor line 13-2 connected with all of first conductor lines, each first conductor line has a width larger than that of second conductor line to thereby a signal path through which high-frequency electric signal passes and which is longer than length of second conductor line is provided, switches 14 are connected to the ends of first conductor lines, whereby selectively opening and closing switches will electrically disconnect and interconnect interspaces between ends of first conductor lines to thereby vary length of signal path and thus change resonance frequency.

11 Claims, 25 Drawing Sheets

VARIABLE RESONATOR AND VARIABLE PHASE SHIFTER

BACKGROUND OF THE INVENTION

1. Field of the Invention

This invention relates generally to the field of high-frequency electrical circuit, and particularly to a variable resonator which permits the resonant frequency to be set at any desired frequency and a variable phase shifter capable of varying phases of signals arbitrarily.

2. Prior Art

In the art of wireless communication utilizing high frequency signals, discrimination of desired signals from unnecessary ones is made by taking signals in a particular frequency band out of a great many signals at all frequencies. The circuit performing this function is called filter and is mounted on many wireless communication apparatuses. Such filters are invariable in the center frequency and bandwidth which are major design parameters. Where a plurality of frequency bands and various frequency bandwidths are used in the wireless communication apparatus utilizing such filters, it is conceivable to provide a plurality of filters for the frequency bands and bandwidths to be used and switch from one filter to another by means of switches. In this instance, however, the problem is that the apparatus is upsized due to the size of the circuitry being enlarged. In view of this problem, the prior art has heretofore conceived various approaches to making variable the resonant frequency of the resonator which is one of the components of the filter in order to realize filters which provide means for varying the center frequency and bandwidth.

Japanese Patent Application Publication No. 6-61092 (literature 1), for example, discloses constructing a resonator from a condenser composed of parallel planar plates and an inductor such that the resonant frequency may be varied by mechanically changing the spacings between the parallel planar plates. This is an example in which a variable resonator is constructed by using lumped-constant circuit elements.

Further, the resonator utilizing a microstrip transmission line which is a distributed-constant circuit is also known as per "The Lecture of Practicable Microwave Technology," Vol. 3, pp. 24-25, pp. 48-49, pp. 199-200 and pp. 219-221 (literature 2). Specifically, FIG. 1 illustrates the construction of the end short-circuited $\lambda/4$ resonator according to the prior art; FIG. 1A being a plan view, FIG. 1B a cross-sectional view taken along the line A1-A1' in FIG. 1A and FIG. 1C a side view seen from the line A2-A2' in FIG. 1A.

This resonator 210, as shown in FIG. 1A, comprises a microstrip line 213 formed of silver on a dielectric substrate 212 having a ground conductor 211 on its back side. The microstrip line 213, having a constant line width W and a length L, has its one end 213*a* short-circuited with the ground conductor 211 at an edge of the dielectric substrate (see FIG. 1C) and the other end 213*b* connected with a transmission line 114.

FIG. 2A illustrates the electric current distribution in the microstrip line 213 of this prior art example. As will be seen from the drawing, the current is concentrated most on the edge portion of the microstrip line 213.

FIG. 2B is a graph showing the simulation results of the reflection coefficient in this prior art example, wherein the frequency having the minimum reflection coefficient is the resonant frequency.

With regard to the phase shifter, in an antenna device having a plurality of antennas and adapted to enhance the directivity by inputting signals with varied phases to the respective antennas, it is required to control the phase of signals to be input to the respective antennas in order to vary the directivity arbitrarily, and hence there is a need for a variable phase shifter capable of changing the phase arbitrarily.

Japanese Patent Application Publication No. 6-216602 (literature 3), for example, proposes that a microstrip line formed on a ferroelectric substrate be used to vary the phase difference between input and output signals by applying a voltage to the ferroelectric substrate to change the dielectric constant to thereby vary the wavelength of the signal passing through the microstrip line.

SUMMARY OF THE INVENTION

However, in the variable resonator with the construction as disclosed in the literature 1 in which the resonant frequency is varied according to the spacings between the parallel planar plates, the configuration is such that the frequency is mechanically and continuously changed, so that it has the problem that the structure for changing the spacings between the parallel planar plates is complicated, accompanied with poor reproducibility and difficulties in controlling the amount of variation in the frequency because the amount of frequency variation may be affected by the environment including the temperature around the resonator.

Further, in the case of the construction as disclosed in the literature 2, there was no effective means for making the resonant frequency variable.

In the variable phase shifter, the construction as disclosed in the literature 3 has the problem that the ferroelectric material used may cause a greater loss because of its dielectric loss ($\tan\delta$) being greater as compared to that of the usual dielectric material. In addition, since the ferroelectric material has hysteresis characteristics in the relation between the voltage applied and the dielectric constant, there is also the problem that it is difficult to control the phase; for if the same voltage is applied twice, the amount of phase varied may be different in some instances because the dielectric constant depends on the voltage applied and the condition at the instant preceding the applying of the voltage.

In view of the problems discussed above, taking advantage of the nature of high-frequency electric signals tending to concentrate on the outer peripheral portion of a signal conductor, the present invention contrives the configuration of the signal conductor such that a particular signal path through which a high-frequency signal will pass is formed and the length of the path may be changed by selectively opening and closing a switch or switches whereby the resonant frequency or the phase of the signal may be varied.

In one aspect, the present invention provides a variable resonator which comprises a signal conductor responsive to an input electric signal of a particular high-frequency to produce resonance, a ground conductor disposed in opposing relation to the signal conductor with a dielectric interposed between the signal conductor and the ground conductor, and one or more switches, wherein the signal conductor comprises one or a plurality of first conductor lines spaced apart by a predetermined distance from each other and a second conductor line connected with the one first conductor line or all of the plurality of first conductor lines, the first conductor line or lines has or have a width different from that of the second conductor line whereby a signal path through which high-frequency signal passes and which is longer than the line length of the second conductor line is defined, one terminal or terminals of the switch or switches is or are connected with the first conductor line or lines while the other terminal or terminals of the switch or switches is or are connected with the second conductor line, or, alternatively both terminals of the switch or switches are connected with a plurality of the first conductor lines, whereby selectively opening and closing the switch or switches will electrically open and interconnect the interspaces between the corresponding conductor lines with which the both terminals of the switch or switches are connected, to thereby vary the length of the signal path and thus vary the resonant frequency.

In one embodiment of the one aspect, there is provided a grounding switch adapted to electrically connect and disconnect the interspaces between one of the first conductor lines and the ground conductor.

In another embodiment of the one aspect, the both terminals of the switch or switches are connected so as to span the interspaces between the end portions of the plurality of first conductor lines.

In another aspect, the present invention provides a variable phase shifter which comprises a signal conductor, a ground conductor disposed in opposing relation to the signal conductor with a dielectric interposed between the signal conductor and the ground conductor, and one or more switches, wherein the signal conductor comprises one or a plurality of first conductor lines spaced apart by a predetermined distance from each other and a second conductor line connected with the one first conductor line or all of the first conductor lines, the first conductor line or lines has or have a width different from that of the second conductor line whereby a signal path through which high-frequency signal passes and which is longer than the line length of the second conductor line is defined, one terminal or terminals of the switch or switches is or are connected with the first conductor line or lines while the other terminal or terminals of the switch or switches is or are connected with the second conductor line, or, alternatively both terminals of the switch or switches are connected with a plurality of the first conductor lines, whereby selectively opening and closing said switch or switches will electrically open and interconnect the interspaces between the corresponding conductor lines with which the both terminals of said switch or switches are connected, to thereby vary the length of the signal path and thus vary the phase of an input signal and hence the phase difference between the input and output signals.

In one embodiment of the second aspect, the both terminals of the switch or switches are connected so as to span the interspaces between the end portions of the plurality of first conductor lines. The effect of the invention According to the present invention, very high reproducibility of the amount of variation in the frequency or the phase is accomplished since the resonant frequency or the phase is varied through the action of the switches. In addition, owing to the simplicity of the structure, the present inventions allows for realizing a variable resonator and variable phase shifter which may not only be easily manufactured, but also have a reduced insertion loss.

Moreover, in the variable resonator and the variable phase shifter according to the present invention, the use of MEMS switches as the respective switches which constitute part of the resonator and phase shifter makes it possible to provide a variable resonator and a variable phase shifter having more excellent properties.

BRIEF DESCRIPTION OF THE DRAWINGS

FIG. 3A' is a plan view showing a part of a modification of the variable resonator shown in FIG. 3A;

FIG. 12A' is a plan view showing a part of a modification of the embodiment 7 of the variable phase shifter shown in FIG. 12A;

BEST MODES FOR CARRYING OUT THE INVENTION

First, it should be noted that the higher the frequency of the electric signals travelling through a signal conductor the more they tend to concentrate on the surface portion of the signal conductor. This is due to the skin effect of high-frequency signals. When electric signals propagate through a signal conductor, the depth through which the signals will penetrate from the surface into the inside of the signal conductor is called skin depth S which is expressed by the following equation 1:

$$\text{Skin depth} = \frac{1}{\sqrt{\pi f \sigma \mu}} \qquad \text{(Equation 1)}$$

wherein f is frequency, $\sigma$ is electrical conductivity of conductor and $\mu$ is magnetic permeability of conductor.

Figure 1A:
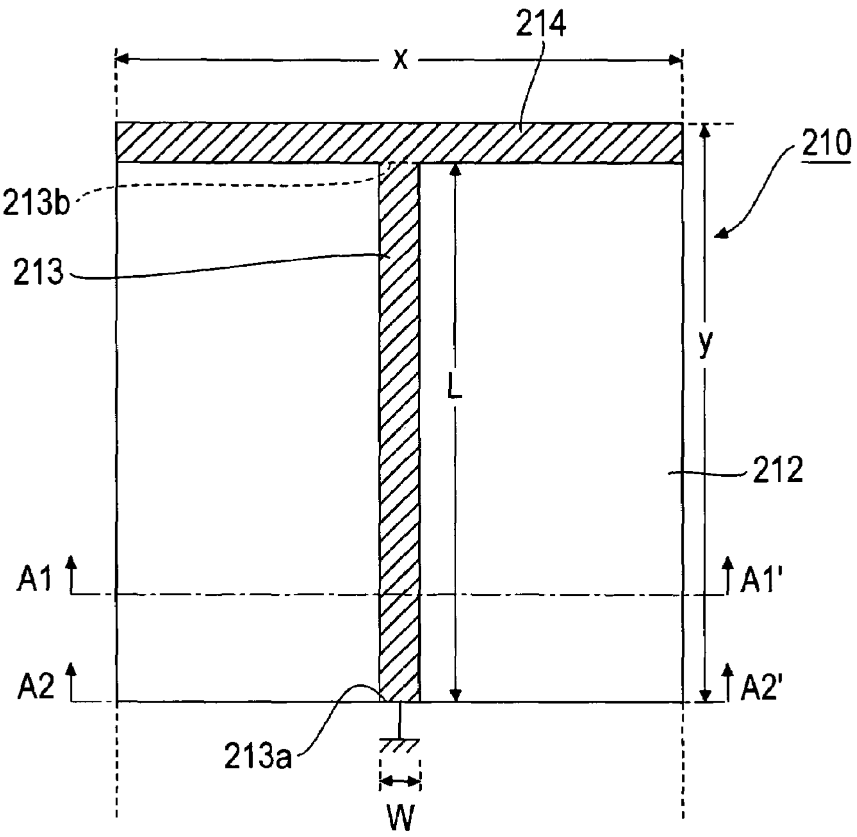
FIG. 1A is a plan view of a prior art resonator using a microstrip line.
Figure 1B:
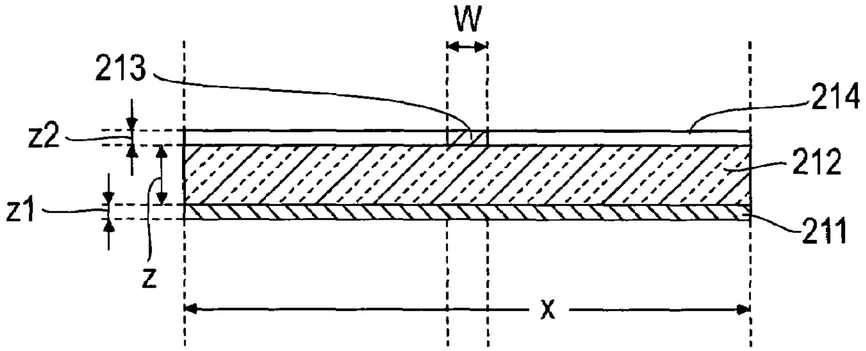
FIG. 1B is a cross-sectional view taken along the line A1-A1' in FIG. 1A.
Figure 1C:
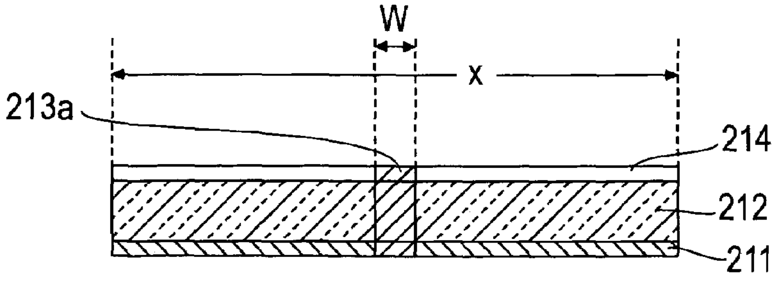
FIG. 1C is a cross-sectional view taken along the line A2-A2' in FIG. 1A.
Figure 2A:
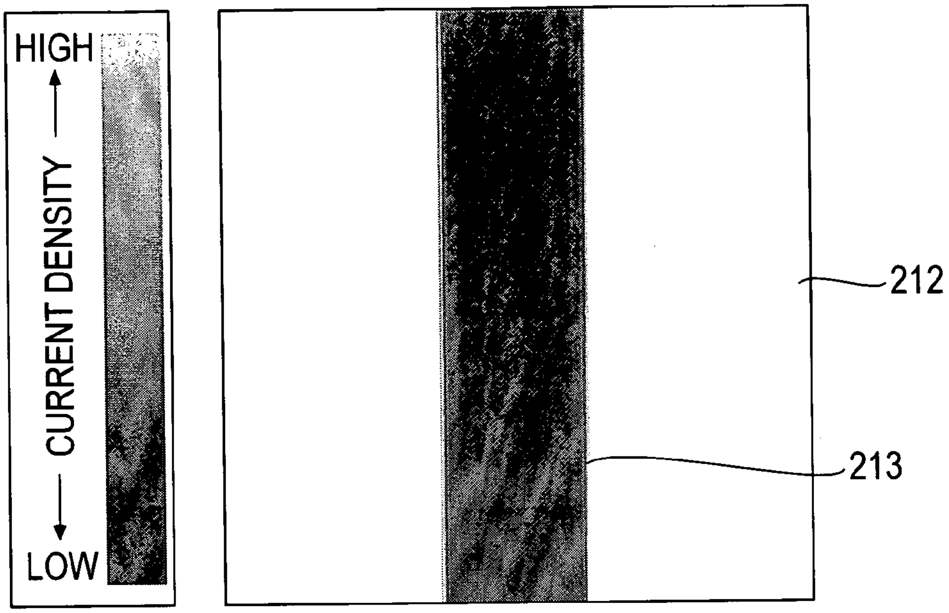
FIG. 2A is a diagram showing the distribution of electric current in the microstrip line of the prior art resonator shown in FIG. 1A.

When electric signal is propagated through a signal conductor formed in a thin film structure, as is appreciated from FIG. 2A showing the distribution of electric current density in the prior art microstrip line 113 illustrated in FIG. 1A, the signal current tends to flow concentrating in the outer peripheral portion of the signal conductor.

The present invention takes advantage of this phenomenon.

Figure 3A:
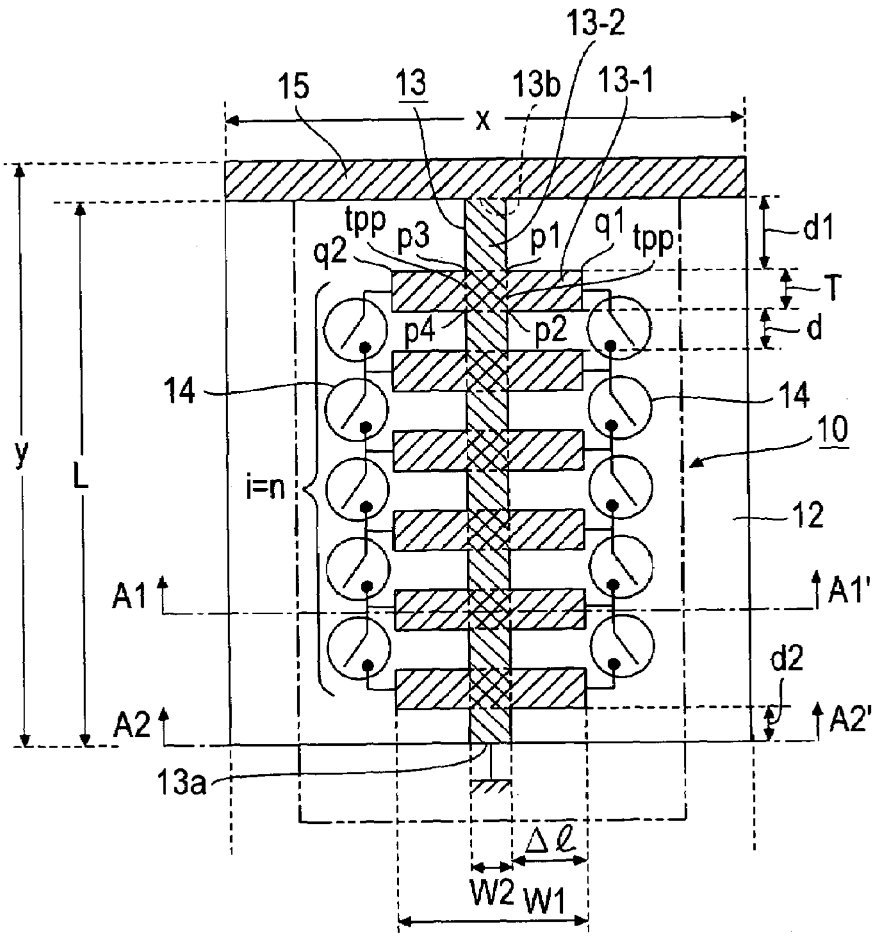
FIG. 3A is a plan view showing the variable resonator of the present invention constructed using a microstrip line.
Figure 3B:
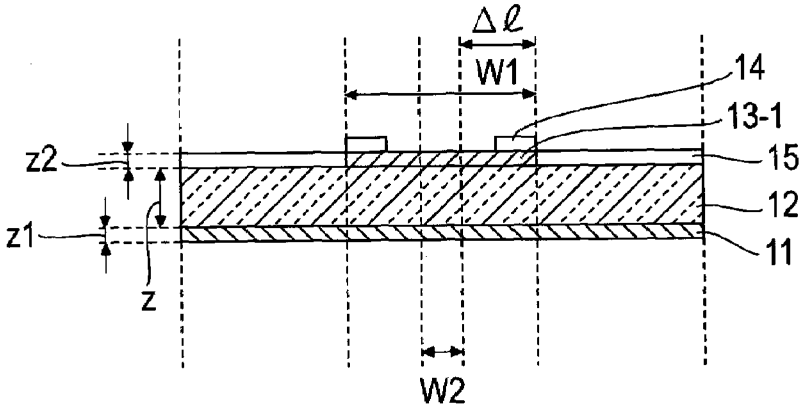
FIG. 3B is a cross-sectional view taken along the line A1-A1' in FIG. 3A.
Figure 3C:
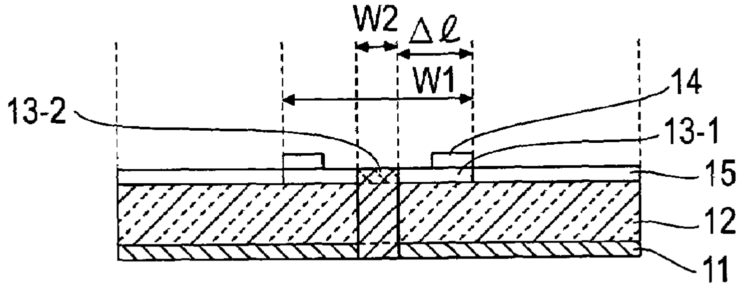
FIG. 3C is a cross-sectional view taken along the line A2-A2' in FIG. 3A.
Figure 3A:
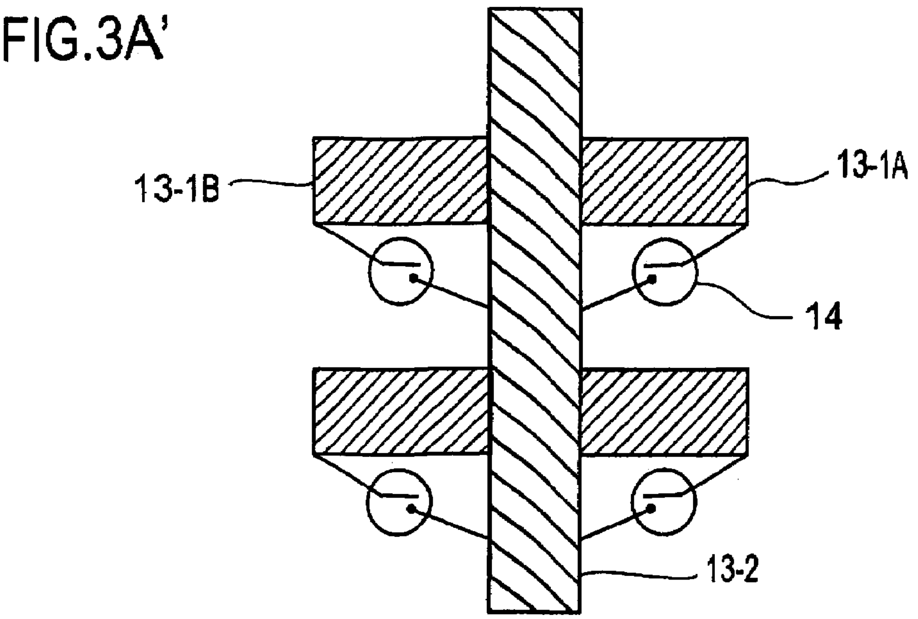

FIG. 3A shows in a plan view showing the fundamental structure of the variable resonator of the present invention wherein a microstrip line is used; FIG. 3B being a cross-sectional side view taken along the line A1-A1' in FIG. 3A; FIG. 3C a cross-sectional view seen from the line A2-A2' in FIG. 3A; and FIG. 3D a plan view illustrating the construction of FIG. 3A as taken from a different point of view.

The variable resonator 10 of this embodiment comprises a microstrip transmission line 13 formed on a dielectric substrate 12 having a ground conductor 11 on the back side thereof, and switches 14, as shown in an area surrounded by two-dotted chain lines in FIG. 3A. The microstrip line 13 comprises n (n is an integer equal to or greater than one) first rectangular conductor lines 13-1 each having a width W1 and a length T and a second rectangular conductor line 13-2 having a width W2 less than the width W1 and a length L longer than the length T. The definitions of the width W1 and length T of the first conductor line 13-1 will be explained later.

One end 13*a* of the second conductor line 13-2 is short-circuited with the ground conductor 11 at an edge of the dielectric substrate (see FIG. 3C) while the other end 13*b* is connected with a transmission line 15. It should be understood, however, that the second conductor line need not be restricted to be connected with the ground conductor.

The second conductor line 13-2 is in the form of a rectangular shape like the prior art microstrip line 213 shown in FIG. 1A and has one or a plurality of first spaced-apart parallel conductor lines 13-1 integrally formed and joined at their centers therewith along the length L extending from the one end 13*a* to the other end 13*b*.

It should be noted here that the length of the first conductor line is defined as a distance T between two cross-points p1 and p2, or p3 and p4 that are positioned on the same side edges of the second conductor line where these cross-points p1, p2, p3, and p4 are defined by cross-contact of the edges of the first and second conductor lines, while the width of the first conductor line is defined as a distance W1 between two farthest points q1 and q2 which are positioned on the outer end portions of the first conductor line and each of which has the farthest distance from the line tpp connecting between two cross-points p1 and p2 or p3 and p4 in the direction perpendicular to this line tpp, respectively. (See FIG. 3A) However, the conductor lines may be made in a configuration including curved shapes such as bent or S-shapes. Consequently, the way in which the length and width of the conductor lines are defined may be changed depending on the design used.

Further, while in FIG. 3A the transmission line 15 and the first conductor lines 13-1 are depicted with differently oriented hatch lines and the first conductor lines 13-1 and the second conductor line 13-2 are also depicted with differently oriented hatch lines and the joint portions of the first and second conductor lines are depicted as if they were superposed one on another, it is just for convenience of clear understanding of the respective conductor line sections, but actually those conductor lines are made of a conductor film integrally formed on the substrate with no boundaries between those conduction lines.

Figure 3D:
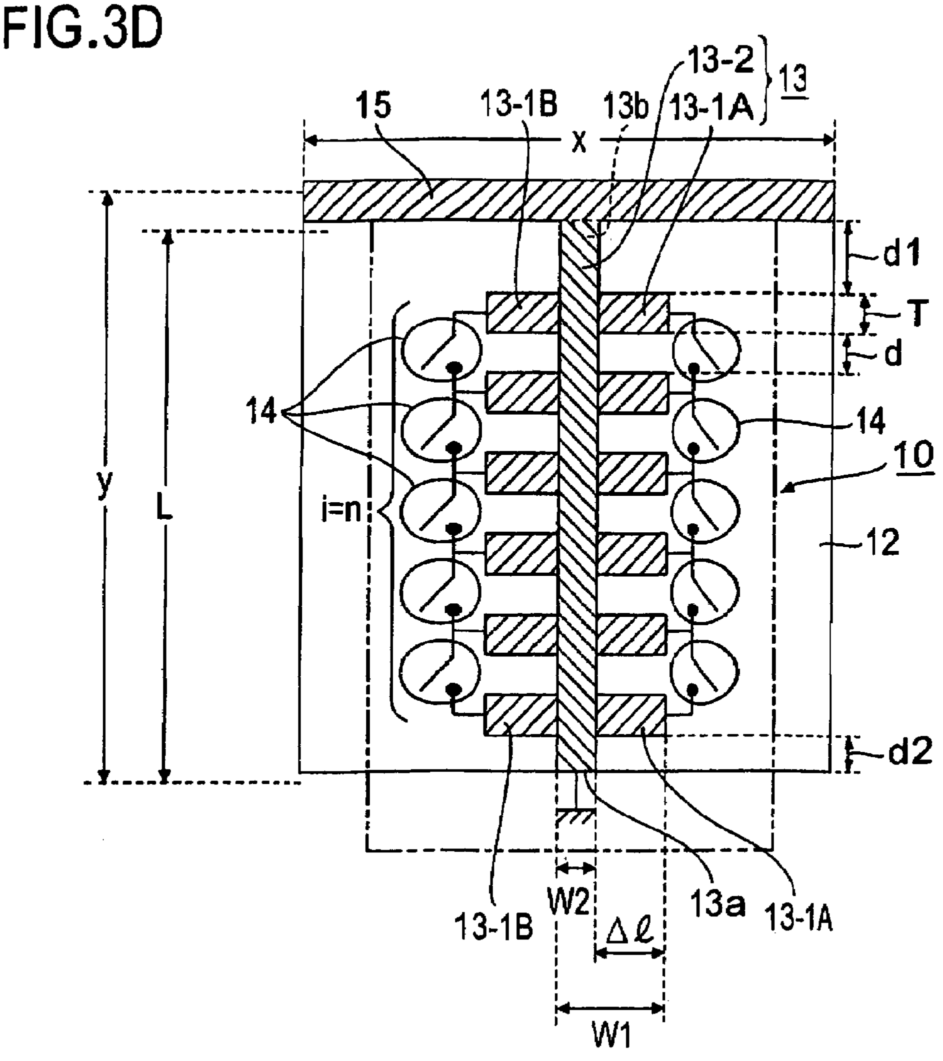
FIG. 3D is a plan view illustrating the microstrip line shown in FIG. 3A as taken from a different point of view.

Accordingly, from a different viewpoint (i.e. second view point) as shown in FIG. 3D, the rectangular first conductor lines 13-1A and 13-1B each having a length T and a width Δl may be individually defined as being joined with the second conductor line having a constant width W2 and a Length L along the opposite outer edges (left and right longitudinal side edges as viewed in FIG. 3D). In that case, there would be no question of the aforesaid "superposing." Further, if the line width W1 of the first conductor line 13-1A or 13-1B in this case (FIG. 3D) is understood to be equal to W2+Δl, it would not be contradictory to the definition W1>W2 in the first mentioned viewpoint. In addition, when the first conductor lines are viewed from this second viewpoint, the first conductor lines 13-1A and 13-1B need not necessarily be joined with the second conductor line at symmetrical points along the opposite side edges of the second conductor line, but may be joined with the second conductor line at different longitudinal points along the left and right side edges of the second conductor line.

As will be appreciated from the foregoing, no matter what the viewpoint is, it is only required the signal conductor 13 according to the present invention be comprised of one or more first conductor lines joined with a second conductor line so as to form a path of signal current having the sum of the lengths of the outer peripheral portions of the first and second conductor lines, which is longer than the length of the path of signal current flowing along the outer peripheral portions of the second conductor line alone.

It should be understood that the configuration of the first conductor lines is not restricted to a rectangular shape, but may be modified in various ways.

Figure 4A:
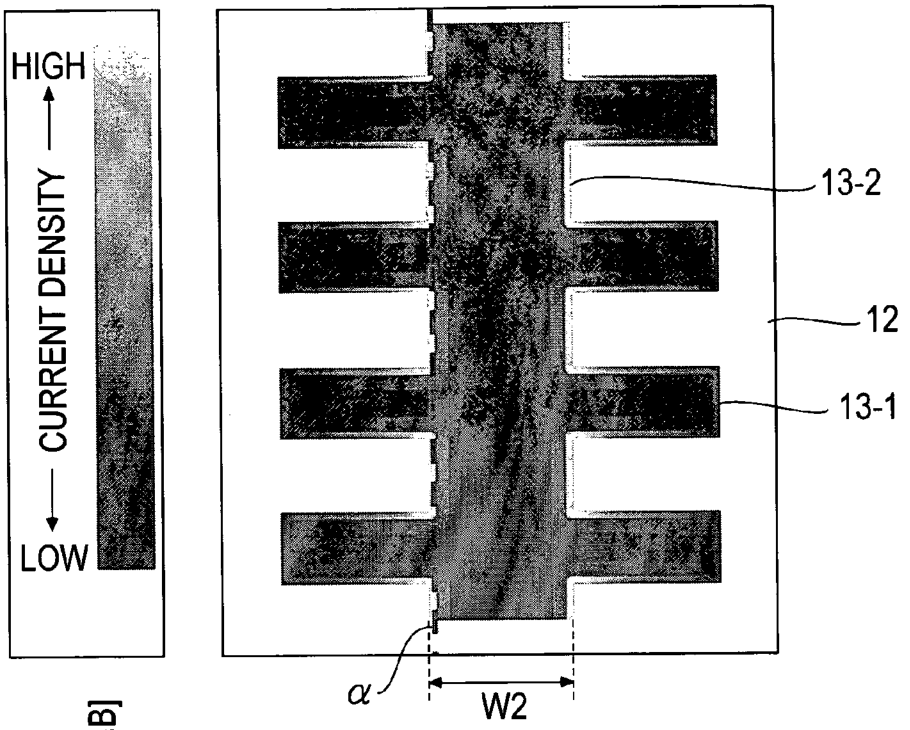
FIG. 4A is a diagram showing the distribution of electric current in the microstrip line of the variable resonator of the basic construction according to the present invention shown in FIG. 3A.
Figure 5:
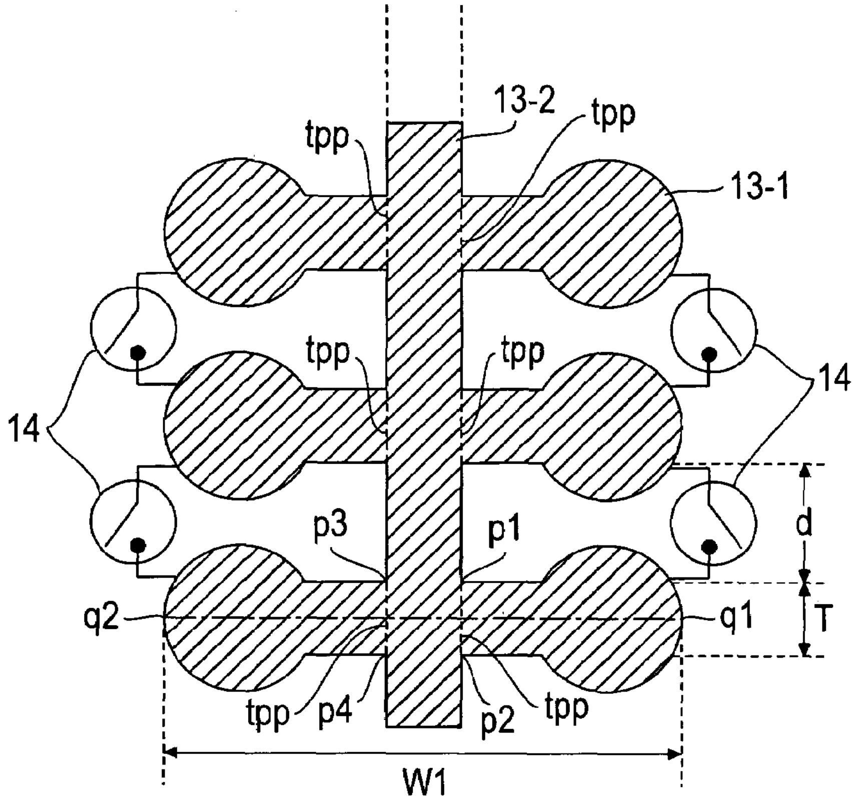
FIG. 5 is a plan view illustrating a modified form of the configuration of the signal conductor, particularly the first conductor lines of the variable resonator according to the present invention.
Figure 6:
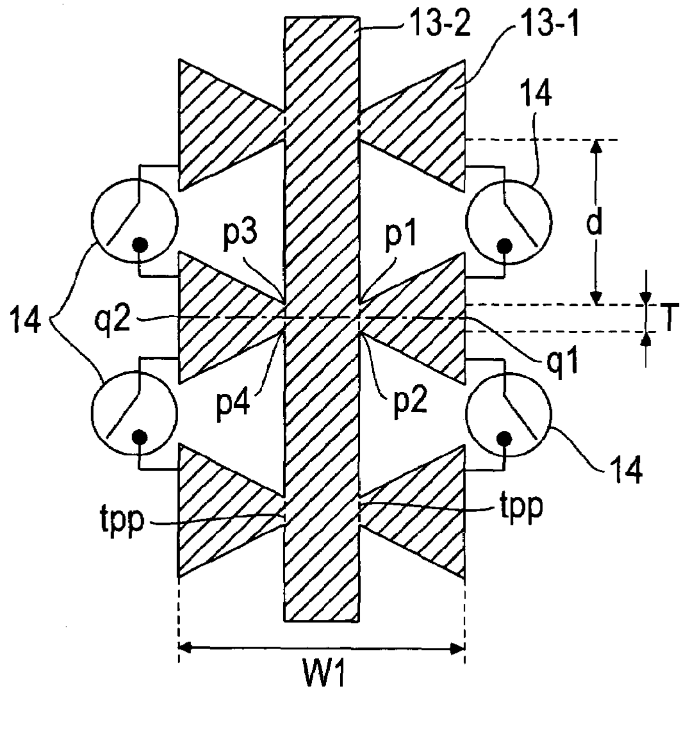
FIG. 6 is a plan view illustrating another modified form of the configuration of the signal conductor, particularly the first conductor lines of the variable resonator according to the present invention.

As modifications of the shape of the first conductor lines, structures such as those shown in FIGS. 5 and 6 for example may be used, and still other structures than those illustrated herein may also be used, provided that they are of such configuration that signals will pass through the outer peripheral portions of the first conductor lines whereby signals will pass along a longer roundabout path rather than along the shortest path α (see FIG. 4A) longitudinal of the signal conductor 13. It is to be noted that in FIGS. 5 and 6 the parts that are similar to those in FIG. 3 are indicated by like reference numerals.

FIG. 5 helps well understanding of the farthest points q1 and q2 that are positioned on the outer end portions of the first conductor line with the farthest distance from the line tpp in the direction perpendicular thereto, so that it also help well understanding of the definition of the width W1 of the first conductor line.

FIG. 6 helps well understanding of the cross points p1, p2, p3 and p4 that are defined by cross-contact of the edges of the first and second conductor lines, so that it also help well understanding of the definition of the length T of the first conductor line.

The number n of the first conductor lines is determined depending on the desired amount of variation in the frequency. In principle, however, it is only required that at least one first conductor line be joined with a second conductor line.

Embodiment 1

On the basis of the fundamental structure shown in FIG. 3A, a specific example of the construction of the embodiment 1 of this invention will be described below with reference to FIGS. 3E and 3F. The dimensions of the various parts are as follows:

The dielectric substrate is formed of alumina and has a size 10 mm in lengthy, 10 mm in width x and 0.635 mm in thickness z, and a specific dielectric constant $\epsilon$ of 9.8.

A silver layer 5 μm in thickness z1 is formed on one side entire surface (entire back surface) of this dielectric substrate as a ground conductor layer.

A silver layer 5 μm in thickness z2 is formed on the other side surface (top surface) of the dielectric substrate such that one portion of the conductor layer forms a transmission line 15 while the other portion of the conductor layer forms a microstrip line 13. This microstrip line 13 comprises a plurality of first conductor lines 13-1 each 0.6 mm in width W1 and 0.1 mm in length T and a second conductor line 13-2 having a length L of 6.1 mm and a width W2 of 0.2 mm. The spacing d between the first conductor lines is 0.1 mm. The distance d1 from one end 13*b* of the second conductor line 13-2 to the closest first conductor line is 0 mm (that is, the first conductor line is formed in contact with the transmission line 15 in this embodiment 1), and the distance d2 from the grounded end 13*a* of the second conductor line 13-2 to the closest first conductor line is 0 mm (that is, the first conductor line is the grounded end in this embodiment 1). The number n of the first conductor lines is 6.

It is to be noted that the transmission line 15 is connected at the middle of its length at right angles to the end 13*b* of the microstrip line 13 in FIG. 3A. (In the embodiment 1 shown in FIGS. 3E and 3F the first conductor line 13-1 is formed to join at right angles to the transmission line 15.) But, the joint between the transmission line 15 and the second conductor line need not necessarily be restricted to be at right angles.

Figure 3E:
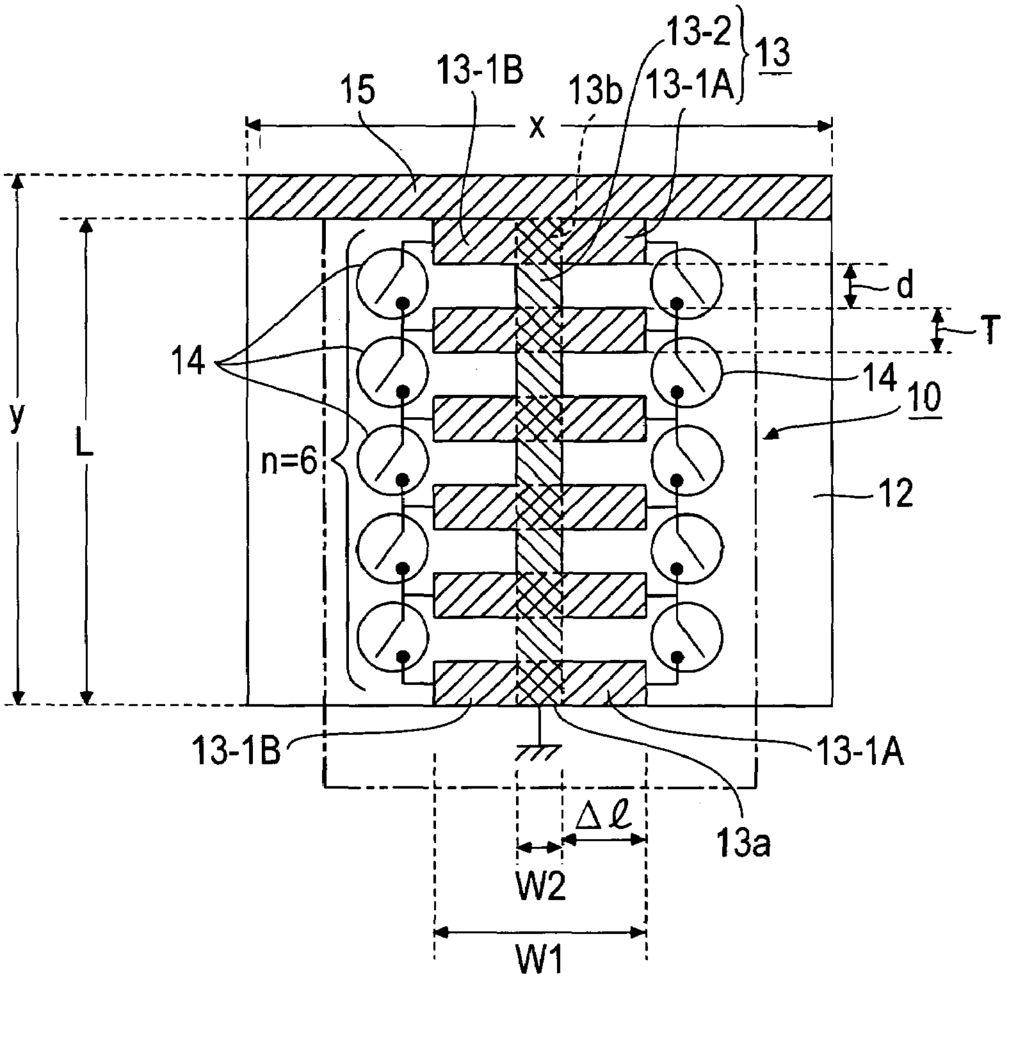
FIG. 3E is a plan view showing the embodiment 1 of the variable resonator with all of the switches being in their open position.
Figure 3F:
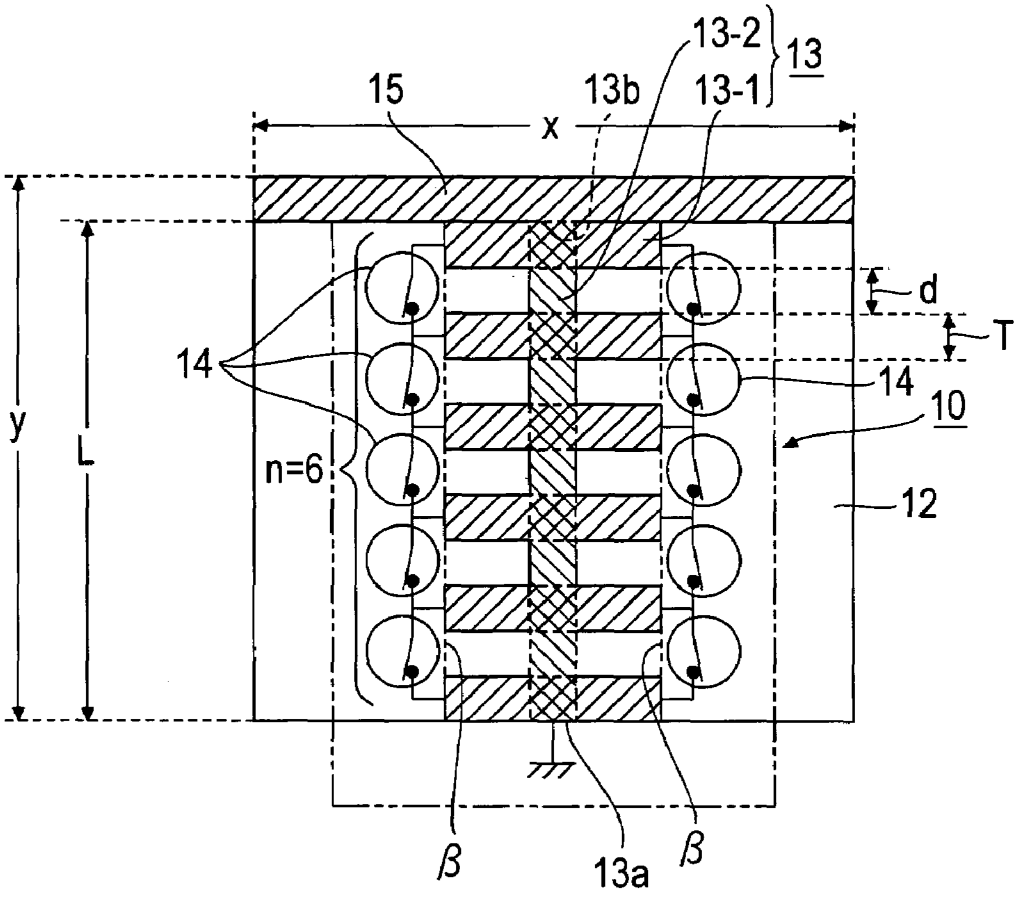
FIG. 3F is a plan view showing the variable resonator of the embodiment 1 with all of the switches being in their closed position (state of electrical continuity or conduction)

FIG. 4A shows the distribution of electric current in the microstrip line 13 constructed according to the embodiment 1 of the invention when the switches are opened as illustrated in FIG. 3E. Compared with FIG. 2A showing the distribution of electric current density in the prior art microstrip line 113 illustrated in FIG. 1A, the electric current in this prior art example is most concentrated on the outer peripheral portions of the microstrip line as is noted from FIG. 2A whereas in the case of the embodiment 1 of the invention, the electric current, as shown in FIG. 4A, does not pass along the shortest path (indicated by the dotted line α) of the signal conductor, but instead flows through the outer peripheral portions of the second conductor line 13-2 having the line width W2 and continues with the outer peripheral portions of the first conductor lines 13-1, whereby eventually the signals propagate along a path longer than the shortest path. This is due to the nature of electric signals tending to flow along outer peripheries of a signal conductor rather than penetrating from the surface into inside of the signal conductor deeper beyond the skin depth S.

As will be appreciated from the foregoing, in the case of the prior art example in which the resonator is constructed by using the line configuration as shown in FIG. 1A, a frequency-nonvariable resonator may be obtained. FIG. 2. shows a simulation result of that resonator, from which it can be seen that the resonator length is substantially equal to the length L of the microstrip line 213.

Figure 4B:
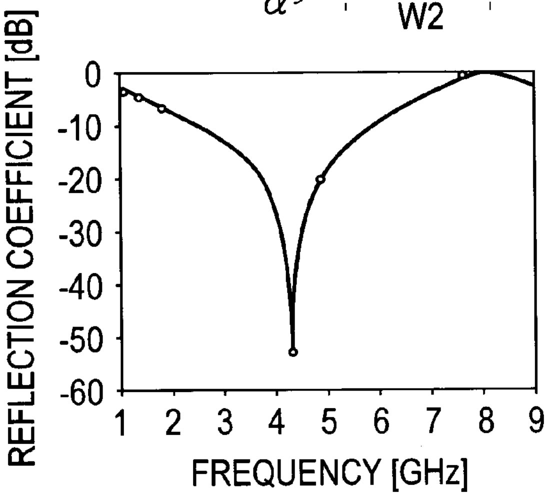
FIG. 4B is a graph showing the results of simulation of the characteristics of the variable resonator of the embodiment 1 with all of the switches in their open position as shown in FIG. 3E.

In contrast, in the case of the present invention in which the line configuration as shown in FIG. 3E is used to form a resonator, the simulation result of that resonator's reflection coefficient is obtained as shown in FIG. 4B. The effective resonator length is expressed as (L+ΔL), that is, the length L of the second conductor line 13-2 indicated in FIG. 3E plus the effects exerted by electric signals flowing along the outer peripheral portions of the first conductor lines 13-1. Here, ΔL represents that amount of the length of the propagating path of electric signals extended by the configuration of the first conductor lines 13-1 and the nature of the electric signals propagating through the outer peripheral portions of the first conductor lines, in addition to the length L. It should be understood, however, that ΔL is considered to be greater than 0 and less than the sum of the variations (Σ(Δl)) in the geometrical length Δl (see FIG. 3E) of the outer edges given by the modifications in shape of the first conductor lines 13-1, since majority of but not all of the electric power of the signals will pass through the outer peripheral portions of the conductor lines, but some of the power will pass through paths shorter than the outer peripheral portions. This is expressed by the following equation:

$$0 < \Delta L < \Sigma\Delta l = 2\sum_{i=1}^{n} \Delta l = 2n\Delta l \qquad \text{(Equation 2)}$$

It should also be noted that if the length T of the first conductor lines 13-1 (see FIG. 3E) is shorter than the skin depth S, the electric current would concentrate the most around the line α because the electric signals would flow along the shortest path (the line α). The effective length of the resonator in this case would be approximate to L. In addition, if the length T is greater than a quarter of the wavelength (λ) of the signal, no effective use can be made of the whole resonator, for the impedance would significantly change due to the existence of the sections (first conductor lines) broadened in the line width whereby the signals would cause reflections within the resonator. For this reason, it is desirable that the length T be greater than the skin depth S and less than λ/4. This relationship is expressed by the following equation:

$$S < T < \lambda/4 \qquad \text{(Equation 3)}$$

Figure 4C:
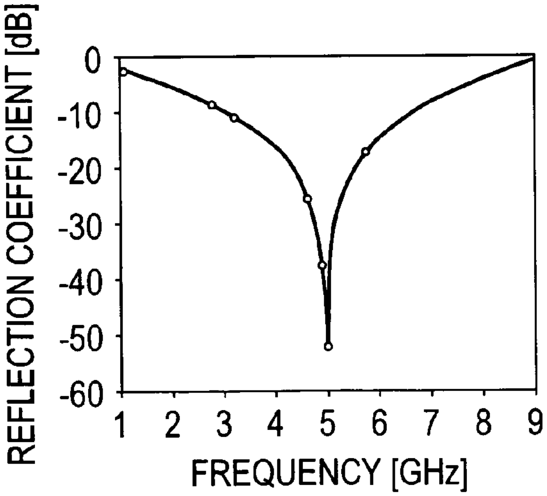
FIG. 4C is a graph showing the results of simulation of the characteristics of the variable resonator of the embodiment 1 with all of the switches in their closed position as shown in FIG. 3F.

FIG. 4B as noted above shows the simulation results on the reflection coefficient when all of the switches 14 are in their open position while FIG. 4C shows the simulation results on the reflection coefficient when all of the switches 14 are brought into conduction (closed position). In these simulation results, the frequency having the minimum reflection coefficient is the resonant frequency.

Figure 2B:
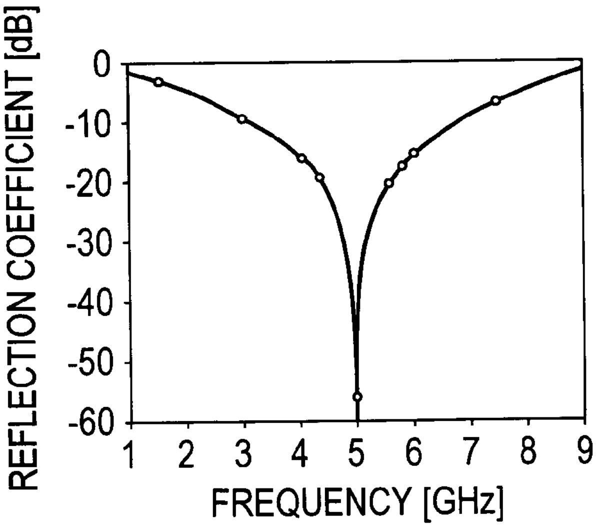
FIG. 2B is a graph showing the results of simulation of the resonant motion of the prior art resonator shown in FIG. 1A.

In comparison with FIG. 2B illustrating the simulation results in the prior art example, the resonant frequency is lower in FIG. 4B showing the simulation results in the case of the present invention where all of the switches are opened, from which it will be appreciated that the effective length of the resonator is increased. In contrast, when all of the switches are brought into conducting state as shown in FIG. 3F, the electric current is concentrated on the location indicated by the dotted line β in FIG. 3F and the signals propagate along the path having a length approximate to the length L, so that the resonant frequency is made higher as compared to the instance shown in FIG. 4B to the extent that it is approximate to the resonant frequency shown in FIG. 2B.

In the present invention, when it is desired to set the resonant frequency intermediate that shown in FIG. 4B and that in FIG. 4C, it is only required to limit the number of the switches to be brought into conduction and to appropriately choose the switches to be brought into conduction. However, as the resonator section has the regions where the electric current will concentrate and those where it will not concentrate distributed along the length thereof, it is desirable to preferentially change the state of those switches located in the regions where the electric current concentrate if it is desired to vary the resonant frequency effectively with fewer switches.

Since the variable resonator according to the present invention is capable of varying the resonant frequency depending on which of the switches are in the state of conduction, there are discretely as many resonant frequencies to be selected as the number of combinations of the switches which may be brought into conduction. It is possible to determine the amount of variation of the frequency and the resolution by designing the configuration of the conductor lines and the mounting location of the switches appropriately. Further, the resonant frequency may be varied with good reproducibility. In addition, since this can be realized only by combination of the conductor lines and switches, no mechanically complicated structure is required, so that it can be realized with a low loss and yet easily. While the mounting location the two terminals of each of the switches are described as being between the end portions of the first conductor lines in this embodiment as shown in FIG. 3A, it need not be restricted to the end portions. When it is desired to vary the frequency finely without increasing the amount of variation, only one terminal of the switch may be connected to the end portion of the first conductor line 13-1 while the other terminal may be connected to the second conductor line 13-2 as shown in FIG. 3A'.

While the switches useful in this invention may include transistors (bipolar, FET and other types) and diodes (PN, PIN and other types) and others, MEMS (Micro Electromechanical System) switches may also be used. MEMS switches are switches the mechanical structures of which can be manufactured finely and with high precision utilizing a manufacturing process similar to that of semiconductor LSI and the state of which can be changed by mechanical actions. It is effective that the switches in this embodiment be mounted at locations where the electric current of signals is concentrated, so that if switches comprising semiconductor such as transistors and diodes are used, they may be deficient in driving capability in some instances, which may possibly result in distortion of the signal waveform. In contrast, MEMS switches are switches of mechanical structure so that they allow for direct connection between low-resistive electrodes (metal or low-resistance semiconductor) or the like and connection by means of capacitance, thereby reducing the tendency to cause distortion of the signal waveform. For this reason, it would be more advantageous to use MEMS switches in some instances. In this regard, it is desirable to minimize the distortion of the signal waveform since it would cause detrimental effects on other systems utilizing the adjacent bands that the distorted signal waveform as such would be a noise which would reduce the communication capacity.

Embodiment 2

Figure 7A:
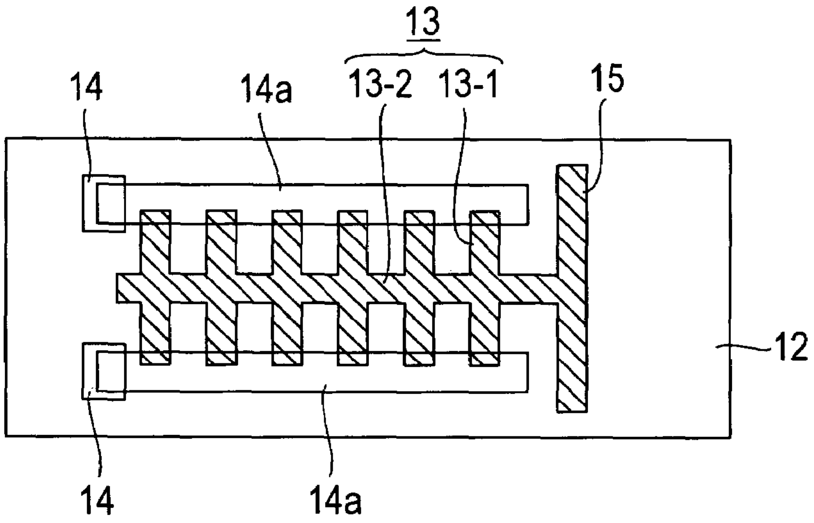
FIG. 7A is a plan view showing the embodiment 2 of the variable resonator of the present invention wherein a microstrip line is used.
Figure 7B:
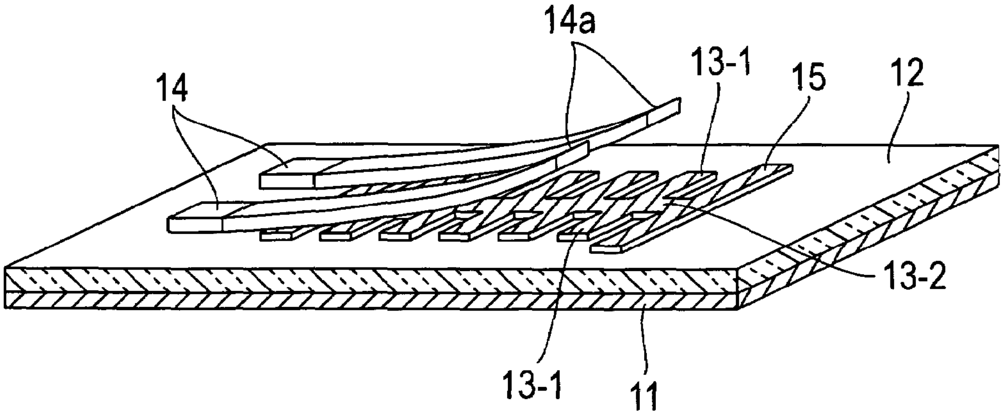
FIG. 7B is a perspective view of the resonator shown in FIG. 7A.

FIG. 7A shows, in a plan view, the embodiment 2 of the variable resonator of the present invention wherein a microstrip line is incorporated, FIG. 7B being a perspective view of the resonator. The parts that are similar to those in FIG. 3 are indicated by like reference numerals. However, while in FIG. 3 the first conductor lines 13-1 and the second conductor line 13-2 are depicted with differently oriented hatch lines just for the benefit of drawing a distinction therebetween, such depiction is omitted in FIG. 7 et seq.

In this construction, as distinct from that shown in FIG. 3, an electrode 14*a* of a single switch is applied and contact all of the end portions of a plurality of first conductor lines 13-1, or alternatively the end portions of the first conductor lines are connected together by capacitive coupling. In the construction shown in FIG. 7A, as the first conductor lines 13-1 are actually formed so as to extend in the opposite directions (upwardly and downwardly as viewed in the drawing) from the center of the second conductor line 13-2, the electrodes 14*a* of two switches are shown as being applied to contact the upper and lower end portions of the first conductor lines, respectively. Alternatively, more than two switches may be provided and the electrodes of those switches may be separately actuated. The electrodes may be deformed by electrostatic force, Lorentz force or thermal stress or a combination thereof The electrodes may assume not only the state in which they contact with all of the locations of the conductor lines as they possible and the state in which they do not contact with all of the locations of the lines, but also, if desired, the state in which they are in contact with some of the locations of the conductor lines. While the state of the electrodes may be changed by the values of control parameters such as electric current or voltage applied to the electrodes, the resonant frequency will change discretely as the amount of variation of the resonant frequency changes depending on the number of the locations of the conductor lines which connect with the electrode. This construction is simpler in structure as compared with the arrangement in which many switches are used, thereby providing a greater ease of manufacture.

Embodiment 3

Figure 8:
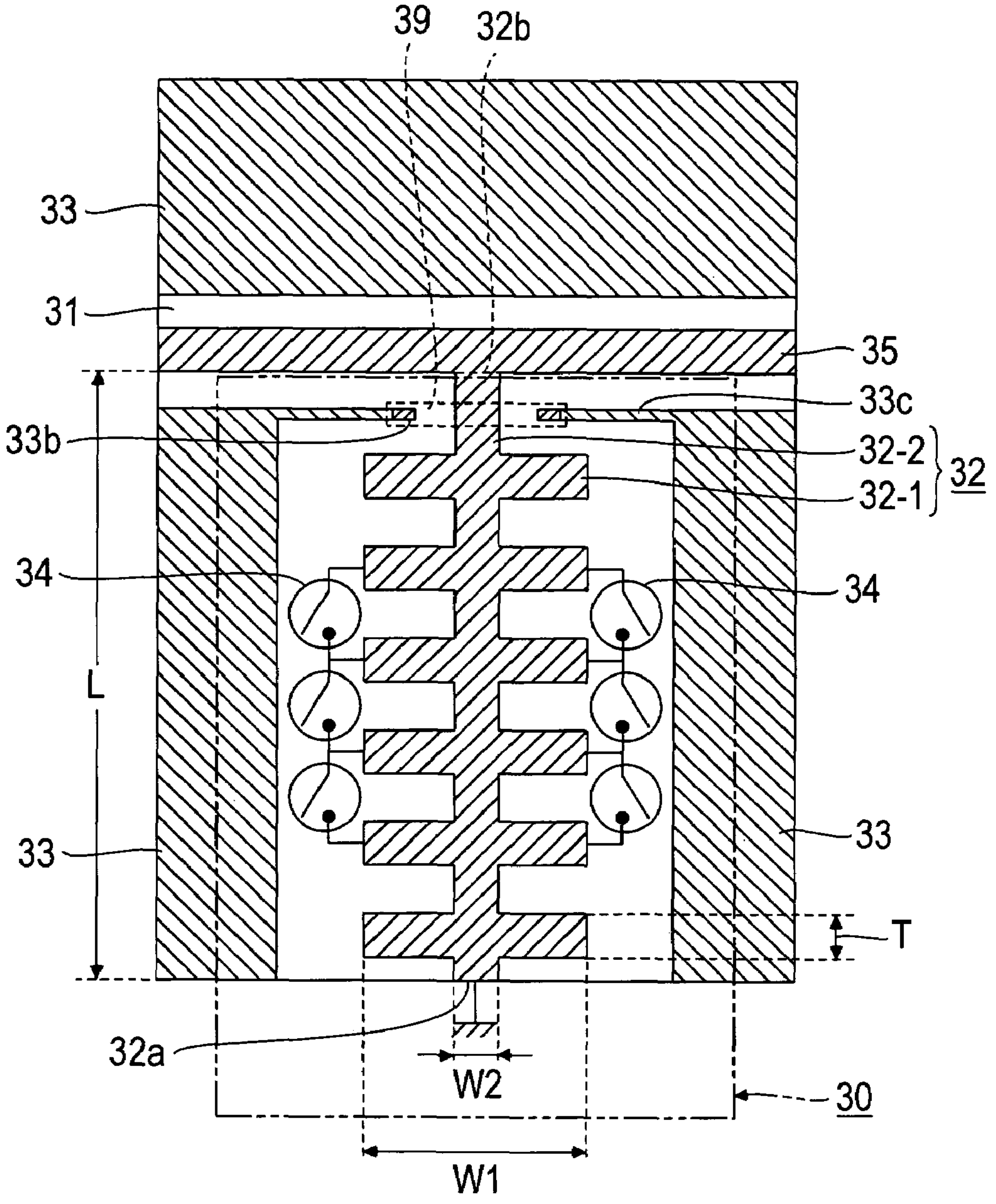
FIG. 8 is a plan view showing the embodiment 3 of the variable resonator of the present invention wherein a coplanar waveguide is used.

As the microstrip line may be equivalently replaced by a coplanar waveguide, a variable resonator in which a coplanar waveguide is incorporated is shown as the embodiment 3 of the present invention in a plan view in FIG. 8. Here again, the parts that are similar to those in FIG. 3 are indicated by like reference numerals.

The variable resonator 30 in this embodiment comprises a coplanar waveguide constructed of a signal conductor 32 formed on one side face of a dielectric substrate 31, ground conductors 33 formed on the same surface of the substrate and on the each sides of the signal conductor, and switches 34.

The signal conductor 32 comprises a plurality of first conductor lines 32-1 and a second conductor line 32-2. The second conductor line 32-2 has its one end 32*a* open and the other end 32*b* connected to a transmission line 35. The first conductor lines 32-1 are each formed in the shape of a rectangle having a length T and width W1, and the second conductor line 32-2 formed in the shape of a rectangle having a length L from the one end 32*a* to the other end 32*b* and a width W2 less than the width W1. There are n (n is an integer equal to or greater than one, six in the illustrated example) first conductor lines 32-1 formed and each of the first conductor lines is joined at its center integrally with the second conductor line 32-2. The shape of the first conductor lines may be modified in various ways as in the embodiment 1.

Like the embodiments 1 and 2, it is defining characteristics of this embodiment 3 that switches 34 are provided in order to connect between the ends of the first conductor lines 32-1 and control their state connect or disconnect the ends of the first conductor lines. In this embodiment as well as in the embodiments described herein before, the switches need not be strictly placed between the adjacent end portions of the first conductor lines.

As distinct from the microstrip line, the coplanar waveguide is of such construction that the ground conductor 33 is formed on the same plane of the dielectric substrate on which the signal conductor 32 formed, so that the electric lines of force from the signal conductor 32 will concentrate on the outer edge portions of the signal conductor. Consequently, the effects of the present invention will be enhanced owing to the electric current concentrating on the outer edge portions of the conductor lines, as compared to the microstrip line.

Embodiment 4

FIG. 9 shows the embodiment 4 of the variable resonator of the present invention wherein a coplanar waveguide is incorporated. The parts that are similar to those in FIG. 3 are indicated by like reference numerals.

This embodiment is similar to the embodiment 3 shown in FIG. 8 except that the ground conductor 33 is formed with pectinate tines 33*a* extending interdigitally between the corresponding adjacent first conductor lines 32-1.

Figures 9A, 9B, 9C, 9D:
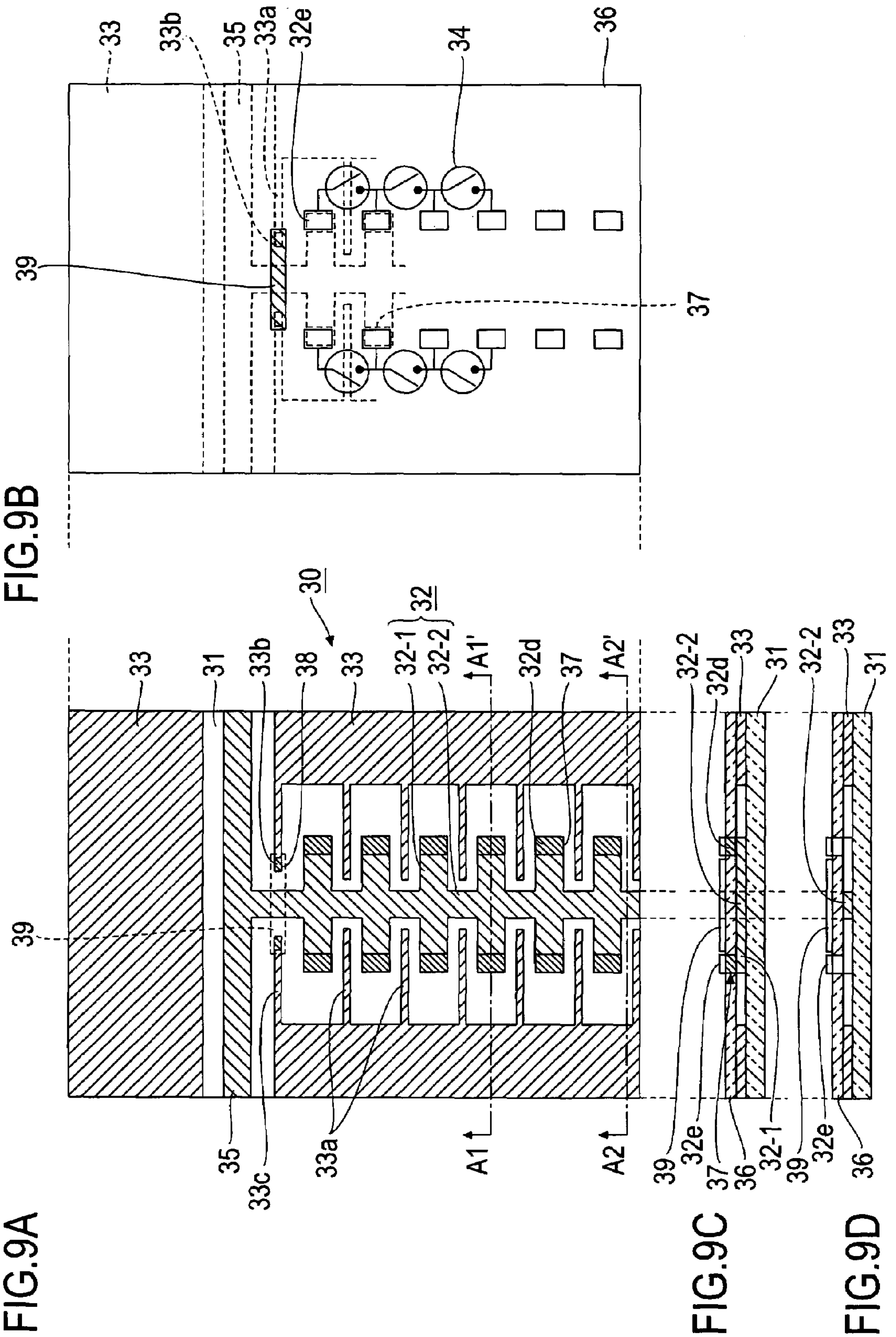
FIG. 9A is a plan view of the embodiment 4 of the variable resonator of the present invention wherein a coplanar waveguide is used, showing an electrode pattern formed by a first metallic film layer.
FIG. 9B is a plan view of a second metallic film layer.
FIG. 9C is a cross-sectional view taken along the line A1-A1' in FIG. 9A.
FIG. 9D is a cross-sectional view taken along the line A2-A2' in FIG. 9A.

The characteristic impedance of the coplanar waveguide depends on the width of the signal conductor and the distance between the signal conductor and the ground conductor. Therefore, in the resonator utilizing a microstrip line a plurality of first conductor lines causes partial discontinuity in the impedance, whereas it is possible in the coplanar waveguide to maintain the characteristic impedance constant by providing the ground conductor with pectinate tines extending interdigitally between corresponding pairs of adjacent first conductor lines as shown in FIG. 9. In this case, however, the ground conductor and the signal conductor is nested inside one another, which may be a cause of obstructions for disposing the switches. In view of this, the resonator may be constructed in a multilayer structure as shown in FIGS. 9A and 9B. Specifically, the signal conductor 32 and the ground conductor 33, which form the coplanar line, are formed on one side face of the dielectric substrate 31, and an electrically insulating layer 36 is formed thereon. This insulating layer 36 has via holes 37 and 38. The ends of the first conductor lines 32-1 are exposed through the via holes 37 and the ends of the pectinate tines 33*c* are exposed through the via holes 38, respectively, and these via holes 37 and 38 are filled with conductors 32*d* and 33*b*, respectively. Switch connection electrodes 32*e* are provided at the places where the conductors 32*d* which fill the via holes 37 are exposed on the surface of the insulating layer 36. The respective switches 34 are connected between the electrodes 32*e*. With this construction, the adjacent ends of the first conductor lines may be connected or not connected with each other by means of the switches. It is thus to be appreciated that the aforesaid obstructions may be avoided. In addition, a connecting conductor path 39 is provided on the surface of the insulating layer 36 so as to cover both places where conductors 33*b* which fill the via holes 38 are exposed on the surface of the insulating layer 36. The connecting conductor path 39 connect the both ends of the pectinate tines 33*c* extending from the ground conductor 33 as seen in FIG. 9A. It is to be noted here that in the embodiment of FIG. 8 as well, although the description was omitted hereinbefore, the opposed ends 33*b* of the pectinate tines 33*c* of the ground conductor 33 are connected together by a connecting conductor path 39.

Embodiment 5

Figure 10:
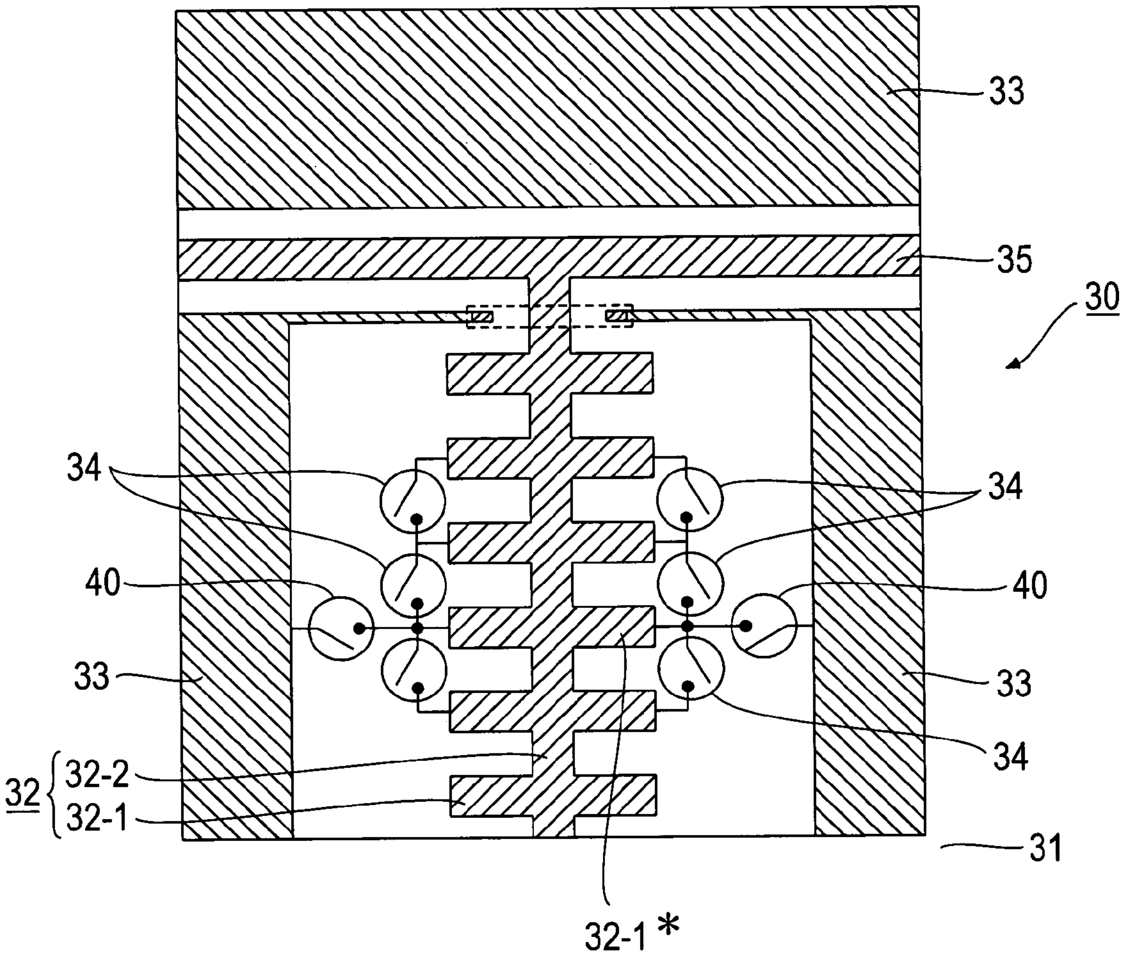
FIG. 10 is a plan view of the embodiment 5 of the variable resonator of the present invention wherein a coplanar waveguide is used.

FIG. 10 shows the embodiment 5 of the variable resonator of the present invention wherein a coplanar waveguide is incorporated.

This embodiment 5 is similar to the embodiment 3 shown in FIG. 8 except that additional grounding switches 40 are provided to connect one 32-1* of the first conductor lines with the ground conductor 33. The parts that are similar to those in FIG. 8 are indicated by like reference numerals.

With this arrangement, it is possible to change the resonator length by a large amount by bringing the grounding switches 40 into conduction, and change the effective resonator length finely by the use of the other switches 34, whereby it is possible to change the resonant frequency not only widely but also finely. While the construction in which the coplanar waveguide is incorporated is described in FIG. 10,a microstrip line and coaxial line can also be used.

Embodiment 6

Figure 11:
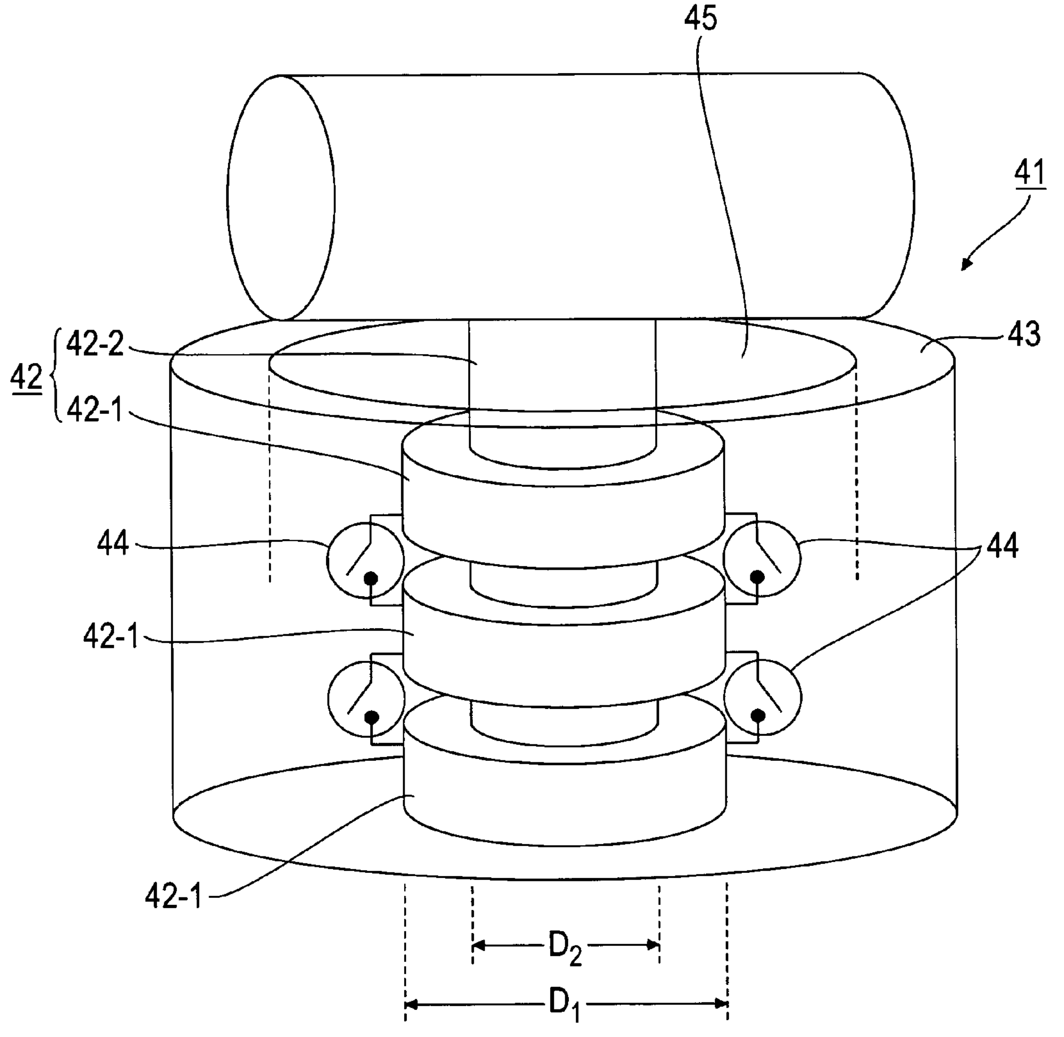
FIG. 11 is a perspective view of the embodiment 6 of the variable resonator of the present invention wherein a coaxial line is used.

FIG. 11 shows the embodiment 6 of the variable resonator of the present invention wherein a coaxial line is use.

The variable resonator 41 in this embodiment comprises a signal conductor 42, a ground conductor 43 formed coaxially with the signal conductor, a dielectric layer 45 filled between the signal conductor 42 and the ground conductor 43, and a plurality of switches 44. The signal conductor 42 comprises a plurality of first conductor lines 42-1 each having a diameter D1, a smaller-diameter second conductor line 42-2 having a diameter D2 less than the diameter D1. The switches 44 are connected between the edge surfaces of the enlarged-diameter first conductor lines 42-1.

The coaxial line has the ground conductor 43 surrounding the signal conductor 42, so that it does not allow the leakage of electric lines of force to the air, and hence it makes it possible to realize a low-loss variable resonator.

While in the various embodiments disclosed so far of the variable resonator according to the present invention a method of direct introduction through a transmission line is used as means for introducing signals into the resonant section, it is to be appreciated that it is possible to use means not requiring direct connection between the transmission line and the resonant section, such as electrostatic coupling, magnetic coupling or electromagnetic coupling which is a combination of electrostatic and magnetic couplings.

While the foregoing description deals with the constructions of the variable resonator utilizing the microstrip line, the coplanar line and the coaxial line, it is to be appreciated that a variable phase shifter may be constructed utilizing such microstrip line, coplanar line and coaxial line according to the present invention. The variable phase shifter will be described hereinbelow with reference to embodiments.

Embodiment 7

Figure 12A:
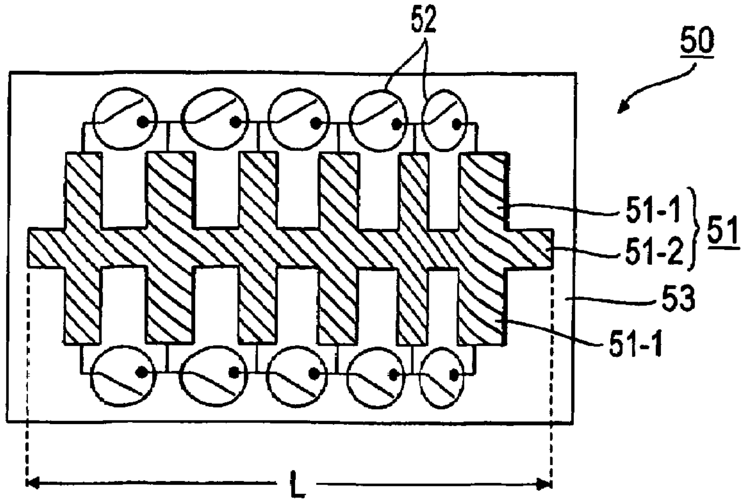
FIG. 12A is a plan view showing the embodiment 7 of the variable phase shifter of the present invention wherein a microstrip line is used, all of the switches being shown in their open position.
Figure 12A:
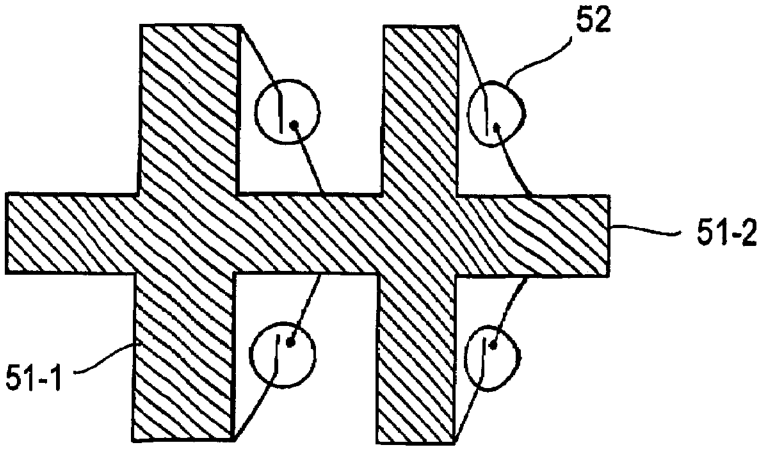

FIG. 12 shows the embodiment 7 of the variable phase shifter of the present invention wherein a microstrip line is used.

Figure 12B:
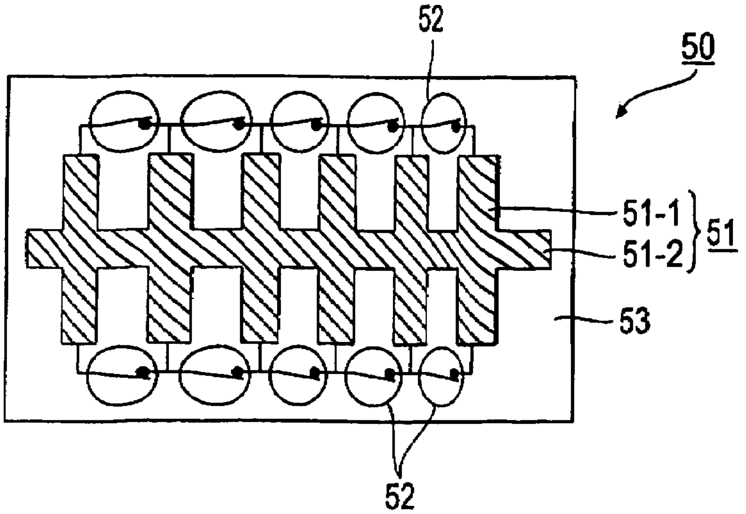
FIG. 12B is a plan view similar to FIG. 12A, but showing all of the switches being in their state of electrical continuity.

The variable phase shifter 50 according to the present invention takes advantage of the same principle that signals will concentrate on the outer peripheral portions of the first conductor lines 51-1 of the signal conductor 51 as that on which the variable resonator is based. Therefore, detailed description is omitted, but it would be sufficient to state that the amount of phase shift effected by the phase shifter may be varied by changing the length of the propagating path of signals concentrating on the outer peripheral portions of the first conductor lines 51-1 of the signal conductor 51 and hence the effective length of the signal conductor by changing the state of the switches 52 connected between the ends of the plurality of first conductor lines 51-1 of the signal conductor 51 (FIG. 12A shows all of the switches being in their open position while FIG. 12B shows all of the switches being in their close position). The reference numeral 53 indicates a dielectric substrate.

Figure 13:
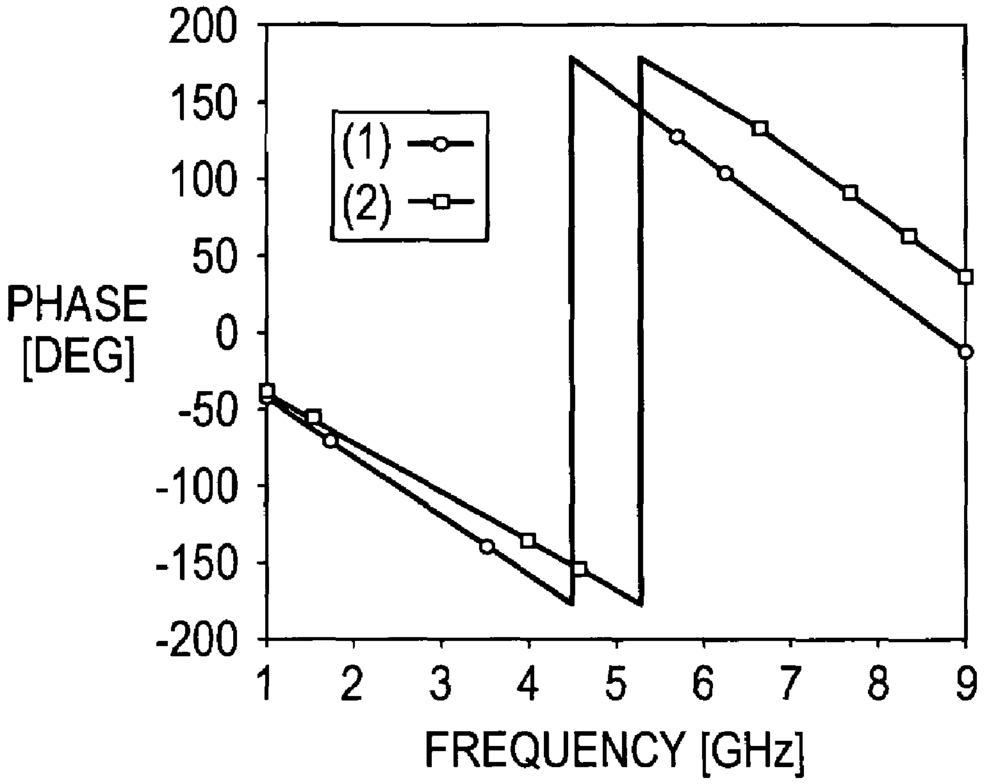
FIG. 13 is a graph showing the results obtained by simulation of the properties of the variable phase shifter shown in FIGS. 12A and 12B.

FIG. 13 shows the results obtained by simulation of the amount of phase shift. The curve (1) shows the properties of the phase shifter when all of the switches are in their open position as shown in FIG. 12A while the curve (2) shows the properties of the phase shifter when all of the switches are in their close position as shown in FIG. 12B. It will be appreciated that the amount of phase shift may be changed depending on the state of the switches and that with all of the switches in the state of conduction, the effective length of the conductor lines is decreased and hence the amount of phase shift is reduced as compared with the instance where all of the switches are in the open position. When it is desired to set the amount of phase shift at a level intermediate the curves (1) and (2), it is only required to limit the number of the switches being in conduction state and select one or more appropriate ones of the switches to be closed.

While the mounting location the two terminals of each of the switches are described as being between the end portions of the first conductor lines in this embodiment as shown in FIG. 12A, it need not be restricted to the end portions. When it is desired to vary the frequency finely without increasing the amount of variation, only one terminal of the switch may be connected to the end portion of the first conductor line 51-1 while the other terminal may be connected to the second conductor line 51-2 as shown in FIG. 12A'.

Embodiment 8

Figure 14A:
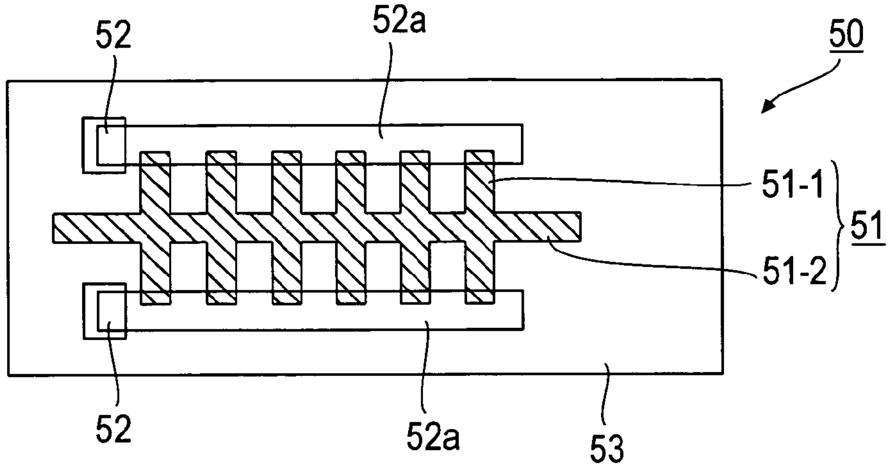
FIG. 14A is a plan view showing the embodiment 8 of the variable phase shifter of the present invention wherein a microstrip line is used.
Figure 14B:
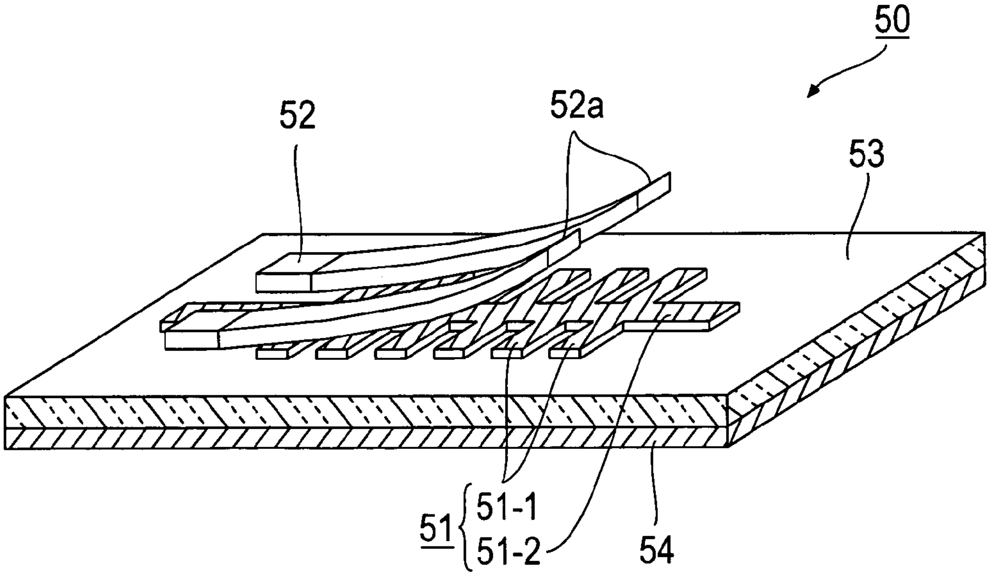
FIG. 14B being a perspective view of the phase shifter of FIG. 14A.

FIG. 14 shows the embodiment 8 of the variable phase shifter of the present invention wherein a microstrip line is incorporated. The parts that are similar to those in FIG. 12 are indicated by like reference numerals. The reference numeral 54 indicates a dielectric substrate disposed on the back side.

In this embodiment 8, as distinct from the construction shown in FIG. 12, an electrode of a single switch is applied and contact or capacitively connect with all of the outer peripheral portions of a plurality of first conductor lines 51-1. In this case, more than two switches may be provided and the electrode 52*a* of those switches (two switches in FIG. 14) may be separately actuated. This construction is simpler in structure as compared with the arrangement in which many switches are used, thereby making it easier to manufacture.

Embodiment 9

Figure 15A:
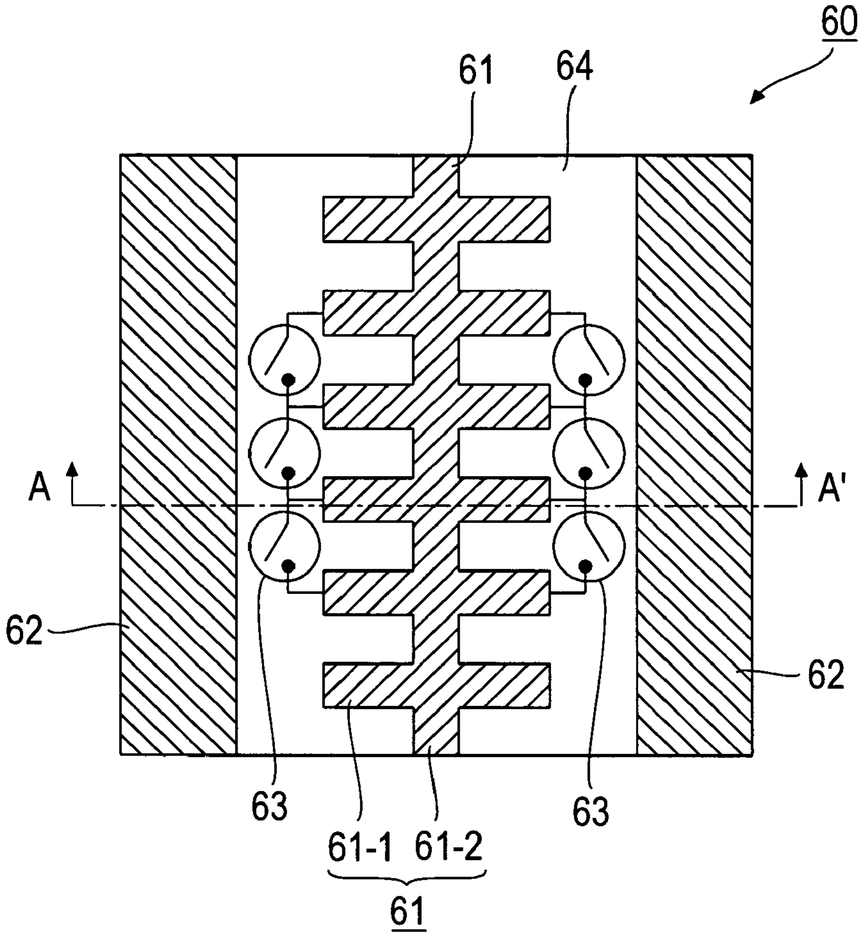
FIG. 15A is a plan view of the embodiment 9 of the variable phase shifter of the present invention wherein a coplanar waveguide is used.
Figure 15B:
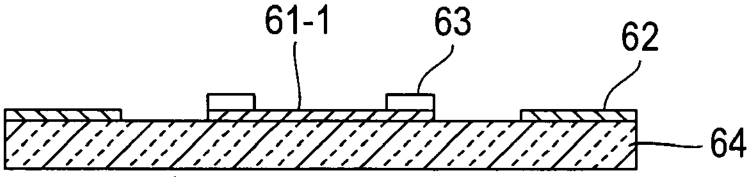
FIG. 15B being a cross-sectional view taken along the line A-A' in FIG. 15A.

FIG. 15 shows as the embodiment 9 of the present invention a variable phase shifter 60 in which a coplanar waveguide is incorporated.

As distinct from the microstrip line, the coplanar waveguide is of such construction that the ground conductor 62 is formed on the same plane of the dielectric substrate on which the signal conductor 61 formed so that the electric lines of force from the signal conductor 61 will concentrate on the outer peripheral portions of the signal conductor. Consequently, the effects of the present invention will be enhanced owing to the electric current concentrating on the outer peripheral portions of the signal conductor, as compared to the microstrip line. Further, the characteristic impedance of the coplanar waveguide depends on the width of the signal conductor and the distance between the signal conductor and the ground conductor. Therefore, whereas in the microstrip line the provision of sections differing in width causes partial discontinuity in the impedance, it is possible to realize a variable phase shifter which allows for reducing reflections of input signals as well as loss by using a coplanar waveguide to set the width of the signal conductor and the distance between the signal conductor and the ground conductor such that the characteristic impedance may not be changed. It will be readily appreciated in the drawing that the amount of phase shift may be varied by providing switches 63 applied to electrically connect and disconnect the ends of a plurality of first conductor lines 61-1 of the signal conductor 61. The reference numeral 64 indicates a dielectric substrate.

Embodiment 10

Figure 16:
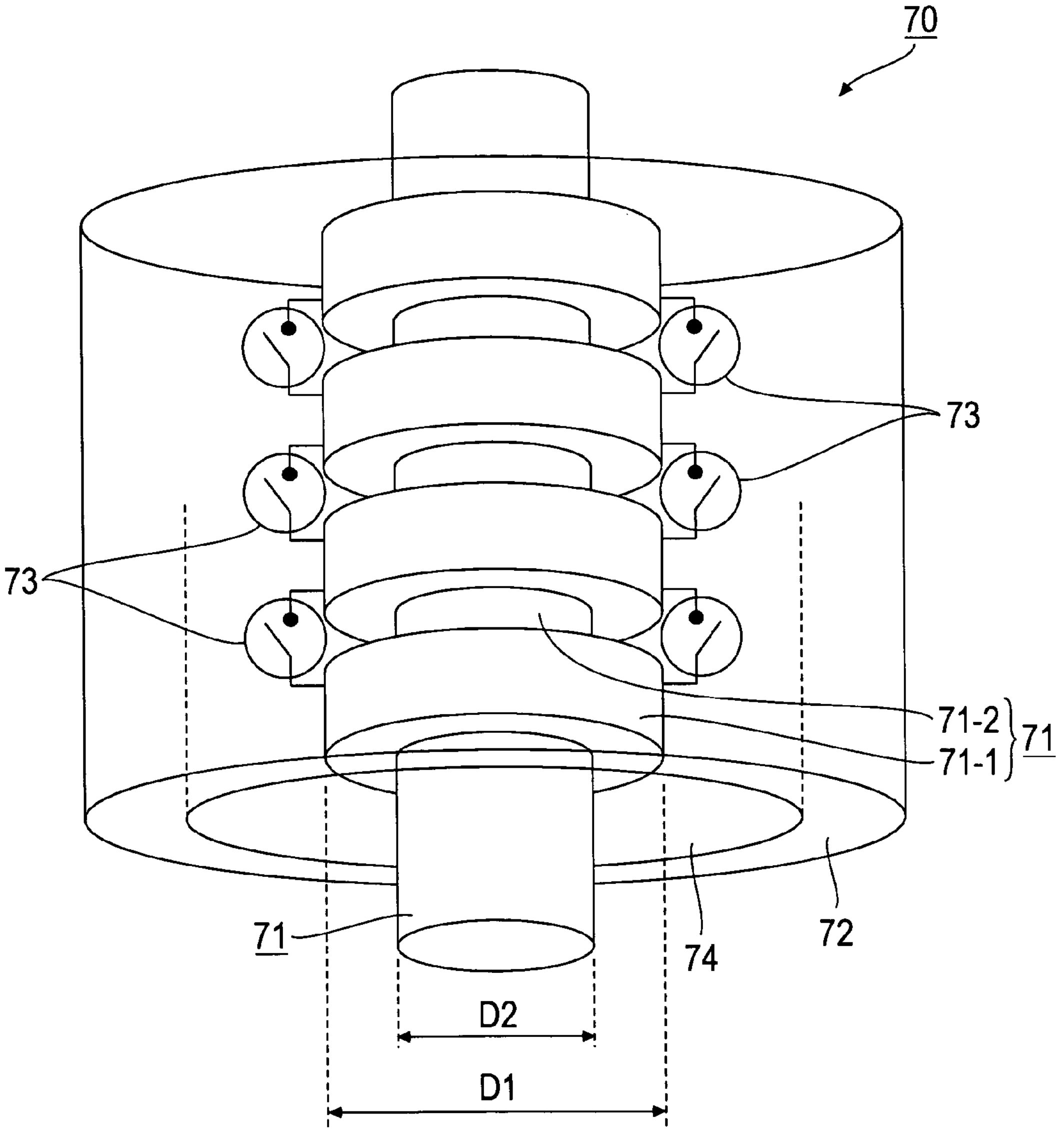
FIG. 16 is a perspective view showing the embodiment 10 of the variable phase shifter of the present invention wherein a coaxial line is used.

FIG. 16 shows as the embodiment 10 of the present invention of a variable phase shifter 70 wherein a coaxial line is incorporated.

The coaxial line comprises a signal conductor 71, a ground conductor 72 surrounding the signal conductor and a dielectric layer 74 interposed between the two conductors, so that it does not allow the leakage of electric lines of force to the air, and hence it makes it possible to realize a low-loss phase shifter.

In this embodiment, the signal conductor 71 comprises a plurality of first conductor lines 71-1 each having a diameter D1 and a smaller-diameter second conductor line 71-2 having a diameter D2 less than the diameter D1, and switches 73 are provided to electrically connect and disconnect the ends of the first conductor lines.

It is possible to realize a variable resonator and/or a variable phase shifter capable of varying the resonant frequency and/or the phase by large amounts of change and yet finely by using a combination of the variable resonators and/or the variable phase shifters of the various embodiments disclosed so far.

Embodiment 11

Figure 17:
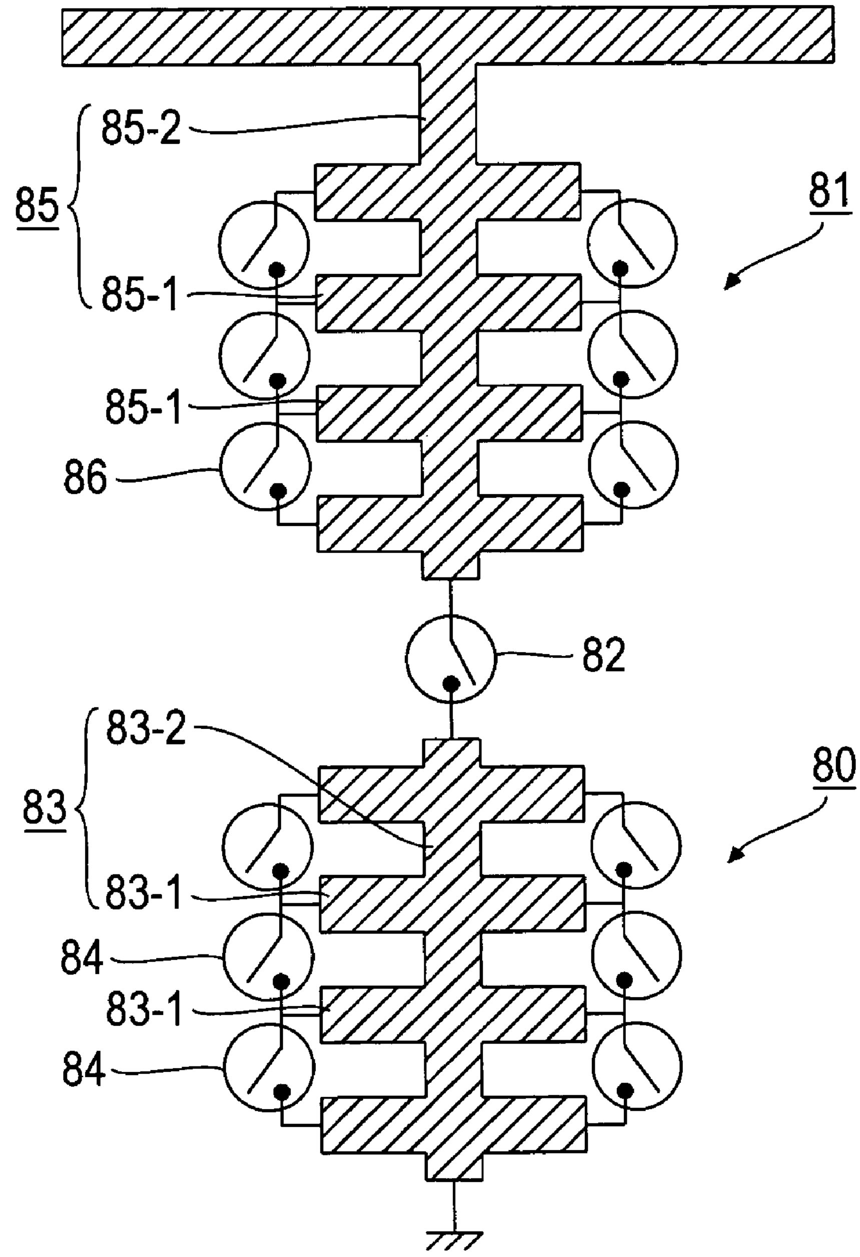
FIG. 17 is a plan view of the embodiment 11 of the variable resonator shifter of the present invention constituted by tandem connecting via a switch a variable resonator and a variable phase shifter both utilizing a microstrip line.

FIG. 17 shows, as the embodiment 11, a variable resonator system constituted by tandem connecting a variable resonator 80 and a variable phase shifter 81, both utilizing a microstrip line, via a switch 82. The variable resonator 80 includes a group of switches 84 applied to electrically connect and disconnect the ends of the first conductor lines 83-1 of the signal conductor 83. Likewise, the variable phase shifter 81 includes a group of switches 86 applied to electrically connect and disconnect the ends of the first conductor lines 85-1 of the signal conductor 85. When it is required to vary the resonant frequency to an extent further than that enabled by changing the state of the group of switches 84, the switch 82 may be turned into the conduction state. Then, when it is desired to vary the resonant frequency finely, the state of any appropriate one or ones of the switches of the groups 84 and 85 may be changed.

Embodiment 12

Figure 18:
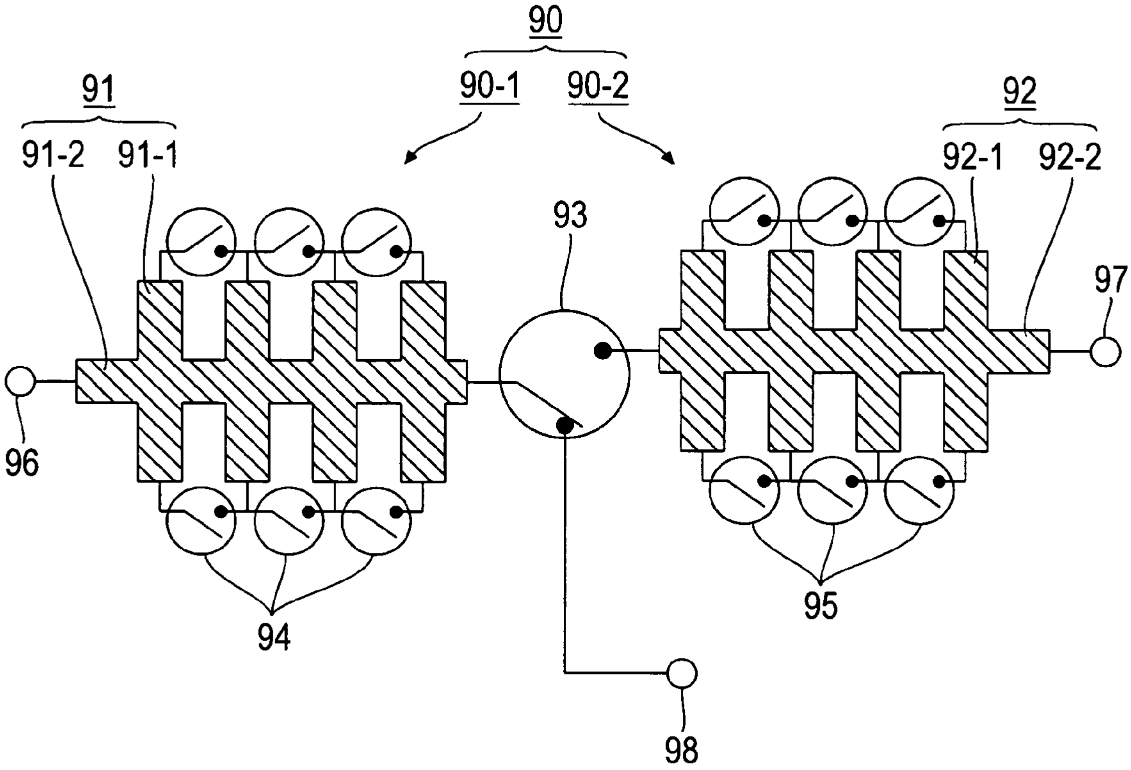
FIG. 18 is a plan view of the embodiment 12 of the variable phase shifter of the present invention wherein two variable phase shifters each utilizing a microstrip line are applied to be tandem connected and disconnected via a switch.

This is a variable phase shifter system 90 shown as the embodiment 12 in FIG. 18 constituted by tandem connected two phase shifter, via a switch 93, a first variable phase shifter 90-1 comprising a microstrip line provided with a group of switches 94 and a second variable phase shifter 90-2 comprising a microstrip line provided with a group of switches 95. The reference numerals 91-1 and 91-2 indicate the first conductor lines and the second conductor line, respectively of the first variable phase shifter 90-1, the reference numerals 92-1 and 92-2 indicate the first conductor lines and the second conductor line, respectively of the second variable phase shifter 90-2, and the reference numerals 96, 97 and 98 indicate an input terminal, an output terminal and an intermediate output terminal, respectively.

While the construction based on the microstrip line is described in FIGS. 17 and 18, a coplanar line and coaxial line may also be utilized.

Embodiment 13

Further modified forms of the present invention will be described below.

Figure 19:
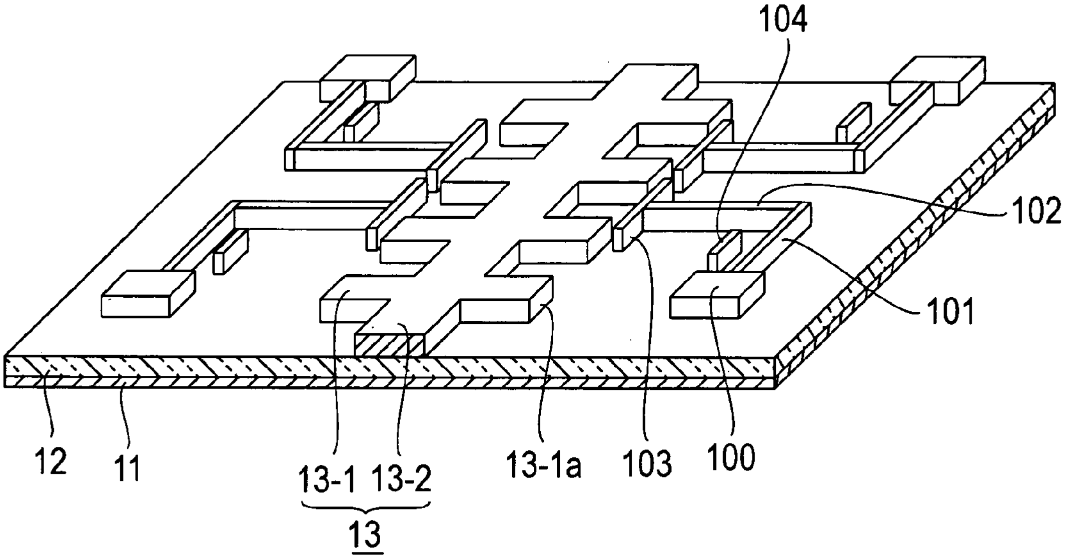
FIG. 19 is a perspective view of the embodiment 13 illustrating a modified form of switches for selectively opening and closing the interspaces between the first conductor lines.

FIG. 19 shows the embodiment 13 representing a modified form of switches, in which the parts that are similar to those in FIG. 3 are indicated by like reference numerals. In this modified embodiment, a plurality of first conductor lines 13-1 are formed on a dielectric substrate such that it has a substantial thickness and end surfaces 13-1*a* perpendicular to the plane of the substrate. Further disposed on the substrate are metal anchors 100, to which metal beams 101 are secured at their one ends such that the other free ends of the beams are movable along the surface of the substrate. Attached to the other free ends of the metal beams 101 are connecting insulator bars 102, to the forward ends of which are secured metal plates 103 having a length sufficient to span the end surfaces 13-1*a* of two adjoining first conductor lines 13-1. Metallic electrodes 104 are mounted on the substrate in opposing relation to the corresponding metal beams 101, the arrangement being such that when switch controlling voltage between the electrodes 104 and the anchors 100 is selectively applied and not applied, electrostatic force is produced and extinguished, whereby the metal plates 103 will connect and open the end surfaces 13-1*a* of the corresponding two first conductor lines 13-1. The reference numeral 11 designates a ground conductor.

Embodiment 14

Figure 20:
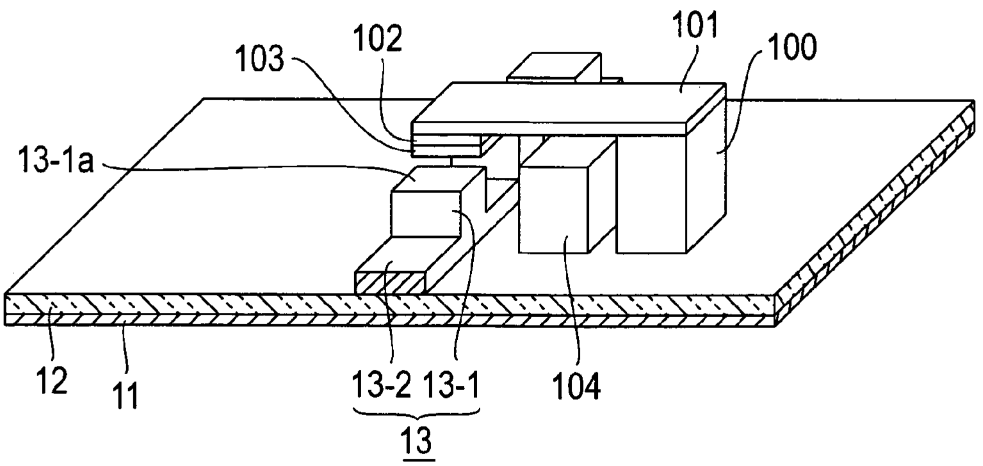
FIG. 20 is a perspective view of the embodiment 14 illustrating a modified form of the first conductor lines and a modified form of the switch for selectively opening and closing the interspace between the first conductor lines.

FIG. 20 shows the embodiment 14 illustrating a modification of the construction shown in FIG. 19, and the parts that are similar to those in FIG. 3 and FIG. 19 are indicated by like reference numerals. In this modified form, the first conductor lines 13-1 are formed so as to be elevated above the second conductor line 13-2 in the direction of height of the dielectric substrate and to have their end surfaces 13-1*a* parallel to the plane of the substrate. The metal beam 101 extending parallel to the substrate is mounted at its one end to the top of the metal anchor 100 such that the other free end of the beam is vertically movable over the first conductor lines. The metal plate 103 is attached with insulator 102 to the free end of the metal beam 101, the arrangement being such that when switch controlling voltage between the metallic electrode 104 and the anchor 100 is selectively applied and removed, electrostatic force is produced and extinguished, whereby the metal plate 103 will connect and open the end surfaces 13-1*a* of the corresponding two first conductor lines 13-1.

Embodiment 15

Figure 21:
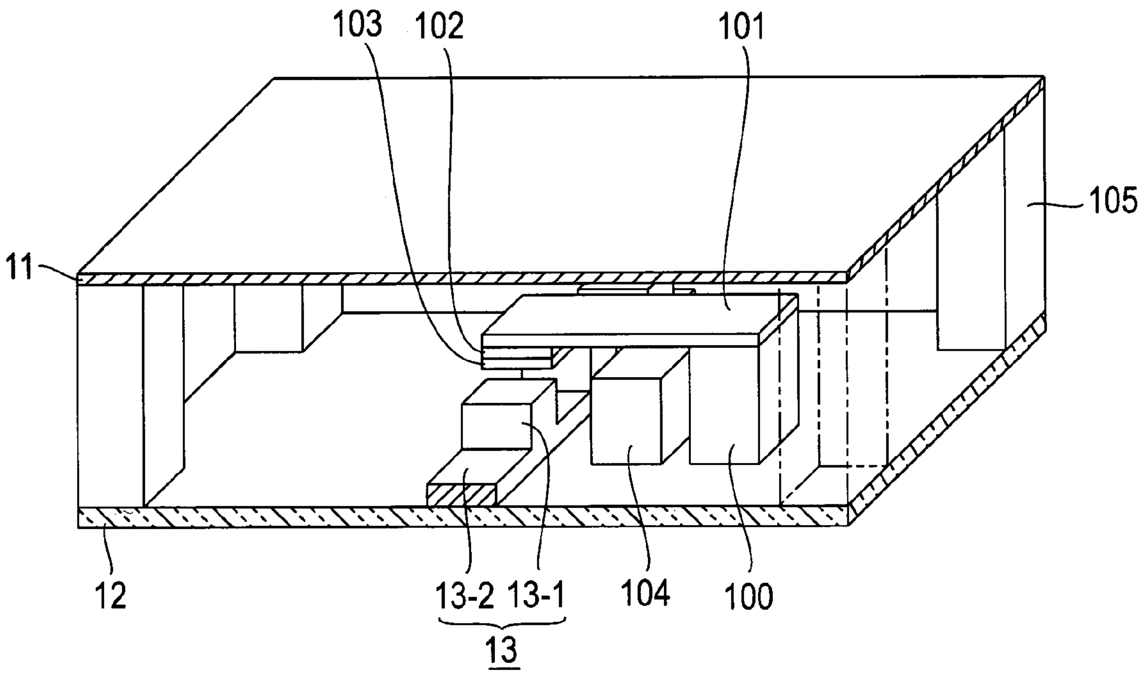
FIG. 21 is a perspective view of the embodiment 15 illustrating a modified form of the substrate in the construction shown in FIG. 20.

FIG. 21 shows the embodiment 15 illustrating a modification of the construction shown in FIG. 20, and the parts that are similar to those in FIGS. 3, 19 and 20 are indicated by like reference numerals. This modified form is similar to the construction shown in FIG. 20 except that the ground conductor 11 is elevated from the substrate 12 by insulator posts 15.

Embodiment 16

Figures 22A, 22B:
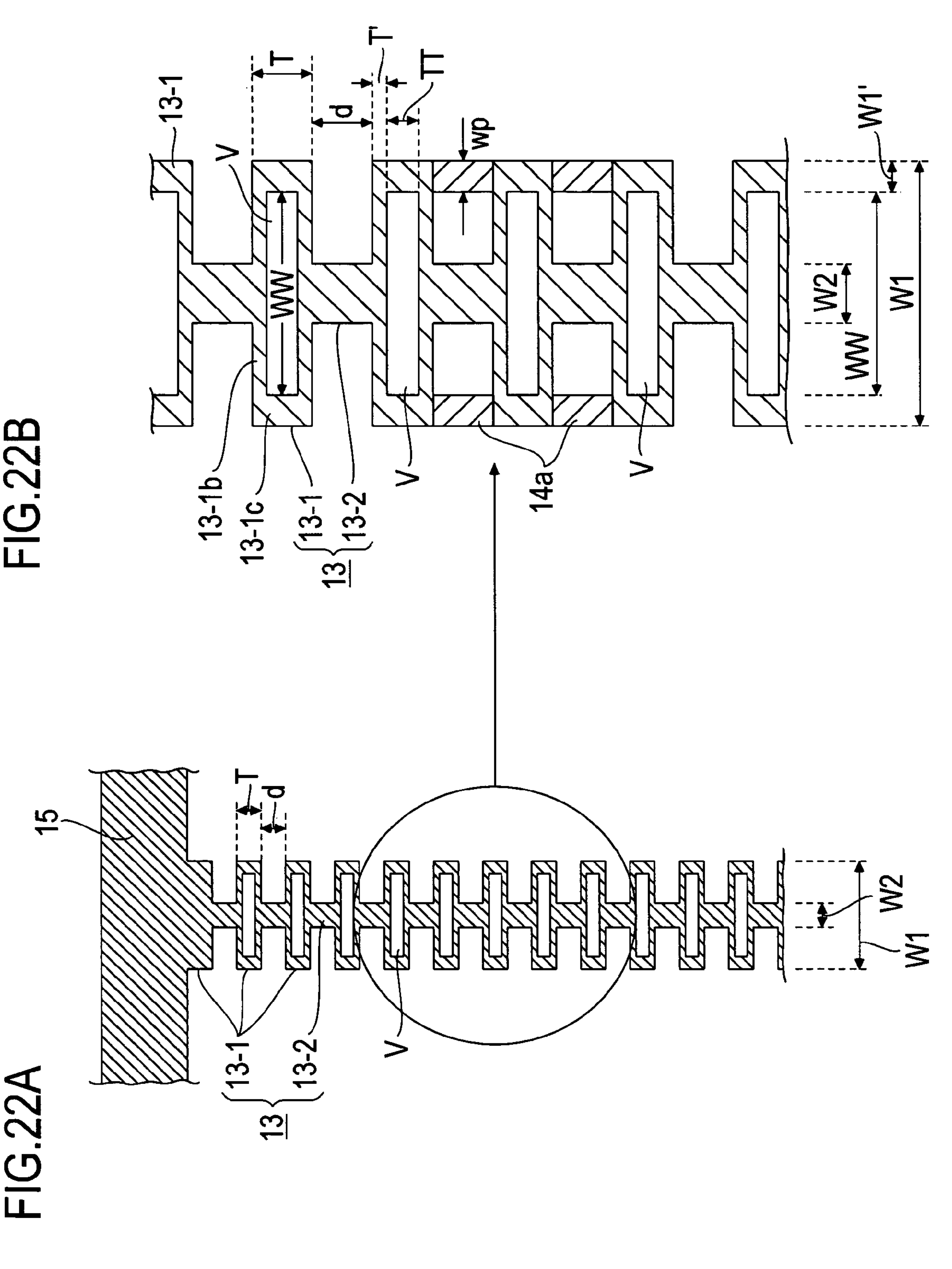
FIG. 22A is a plan view of the embodiment 16 illustrating a modified form of the signal conductor shown in FIG. 3.
FIG. 22B is an enlarged view of the principal part of the signal conductor shown in FIG. 22A.

The signal conductor has been so far described as comprising a plurality of first conductor lines and a second conductor line connected integrally with all of the first conductor lines, the conductor lines being in the form of conductor film formed on a substrate, as shown in FIG. 3A. FIG. 22 illustrates the embodiment 16 representing a modified form of such signal conductor, FIG. 22A is a plan view and FIG. 22B is an enlarged view of the principal part of the signal conductor shown in FIG. 22A. The parts that are similar to those in FIG. 3 are indicated by like reference numerals and characters.

In the drawing, each of the first conductor lines 13-1 is of a rectangular shape having a line length T and a width W1, but has an area V devoid of conductor film therewithin. This conductor film-devoid area V has a length TT and a width WW, hence the first conductor line 13-1 is shaped like a frame. The frame portion includes transverse bar portions 13-1*b* extending widthwise of the first conductor line 13-1 and longitudinal bar portions 13-1*c* which correspond to end portions of the first conductor lines and is extending lengthwise of the first conductor line 13-1. The transverse bar portions 13-1*b* each have a length T' and a width W1 while the longitudinal bar portions 13-1*c* each have a length T and a width W1'. The transverse bar portions 13-1*b* and the longitudinal bar portions 13-1*c* partly overlap each other. One or more switch electrodes 14*a* are disposed between the ends of the first conductor lines such that the electrodes are selectively connected and disconnected between the ends in response to closing and opening of associated switches 14 (not shown). The width wp of the switch electrode is selected to be substantially equal to the width W1' of the longitudinal bar portions 13-1*c* that are the end portions of the first frame-like conductor line 13-1 (although, of course, it need not necessarily be equal to the width of the longitudinal bar portions). In addition, the width wp, width W1' and length T' are selected to be greater than the skin depth S. Further, the line width W2 of the second conductor line 13-2 is selected to be greater than 2·S and equal to or less than the WW, as represented by the following equation:

$$2\cdot S<W2\leqq WW\leqq W1-2\cdot S \quad \text{(Equation 4)}$$

With this construction, the current density of high-frequency signals which will pass through the end portions of the first conductor lines is increased compared to that in the construction shown in FIG.3, whereby the length of path along which the electric current flows becomes substantially longer than that in the construction shown in FIG. 3. When the switches 14 are brought into their closed position, almost all of the signals will pass along the path short-circuited by the electrodes 14*a* between the end portions of the first conductor lines. It is thus to be appreciated that the range of variation in the frequency caused by the selective opening and closing of the switches may be expanded by about 10% as compared to the construction shown in FIG. 3.

Although all of the first conductor lines 13-1 in the microstrip line 13 illustrated in FIG. 22 are described as having conductor film-devoid areas V, only some of the plurality of first conductor lines may have such conductor film-devoid areas V

Figure 23A:
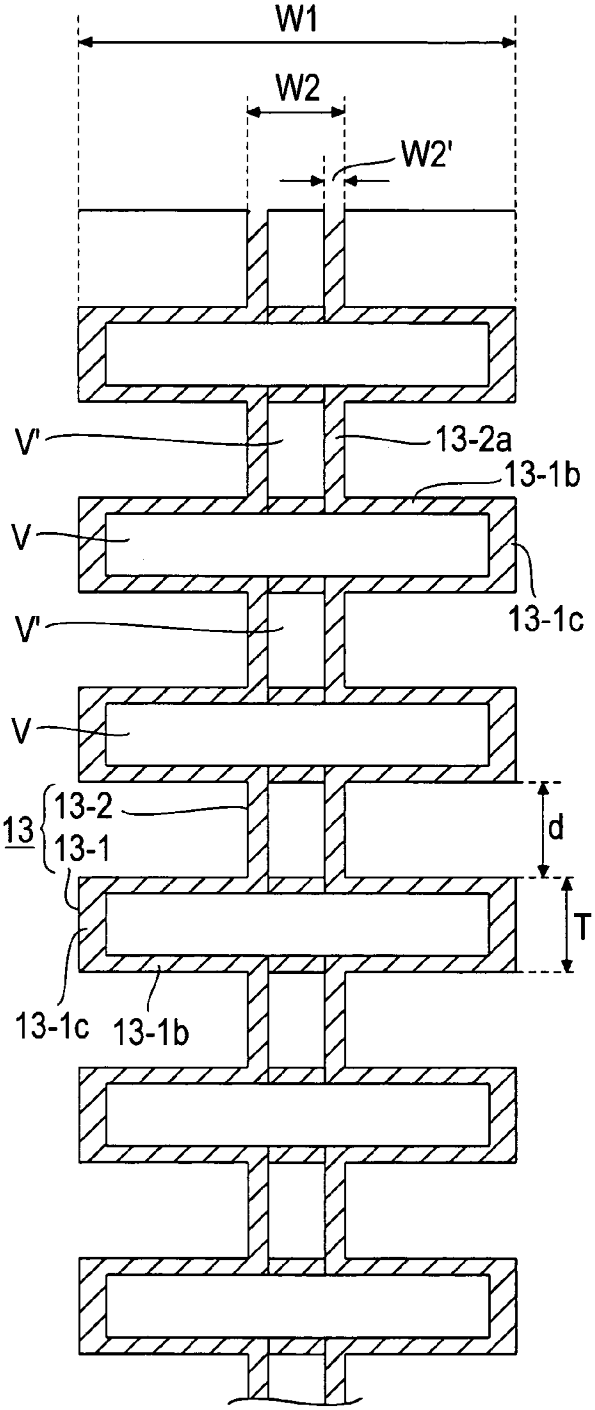
FIG. 23A is a plan view of the embodiment 17 illustrating a modified form of the signal conductor shown in FIG. 22.

Embodiment 17 the second conductor line 13-2 may be configured so as to have conductor film-devoid areas V' at respective sections thereof such that they do not join the conductor film-devoid areas V in the first conductor lines, as shown as the embodiment 17 in FIG. 23A. In this case, the width W2' of the longitudinal frame bar portions of the second conductor line is selected to be greater than the skin depth S. With this construction, almost all of high-frequency signals will pass along the shape of the frame bar portions of the signal conductor.

Figure 23B:
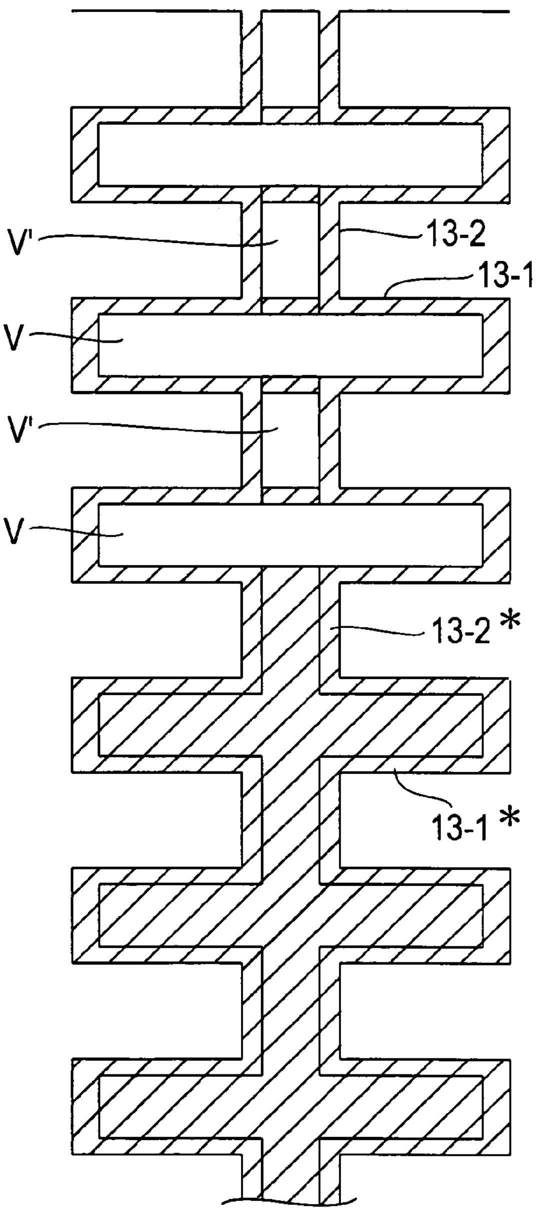
FIG. 23B is a view showing a further modified form of the signal conductor of FIG. 22A.

Further, as shown in FIG. 23B, a modified configuration is also possible. In this configuration, one or some of the first conductor lines and one or some sections of the second conductor line are formed with such conductor film-devoid areas V or V', respectively while the remaining first conductor lines 13-1* and the remaining sections 13-2* of the second conductor line do not have such areas.

Embodiment 18

Figure 24A:
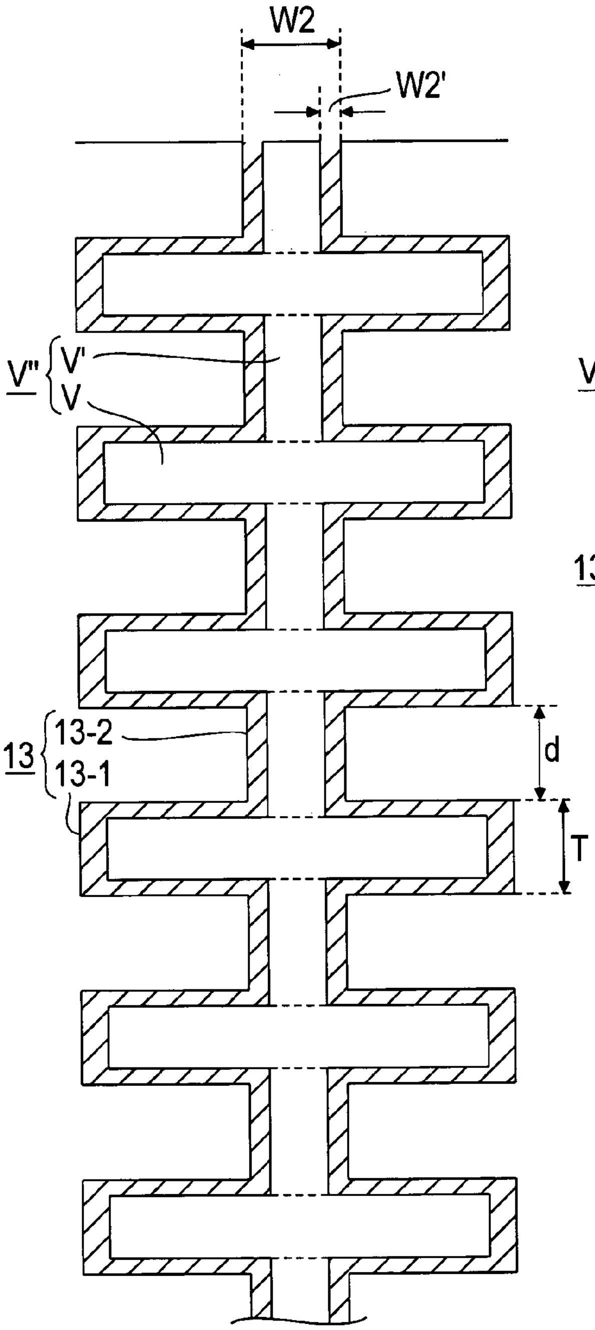
FIG. 24A is a plan view of the embodiment 18 illustrating another modified form of the signal conductor shown in FIG. 3.
Figure 24B:
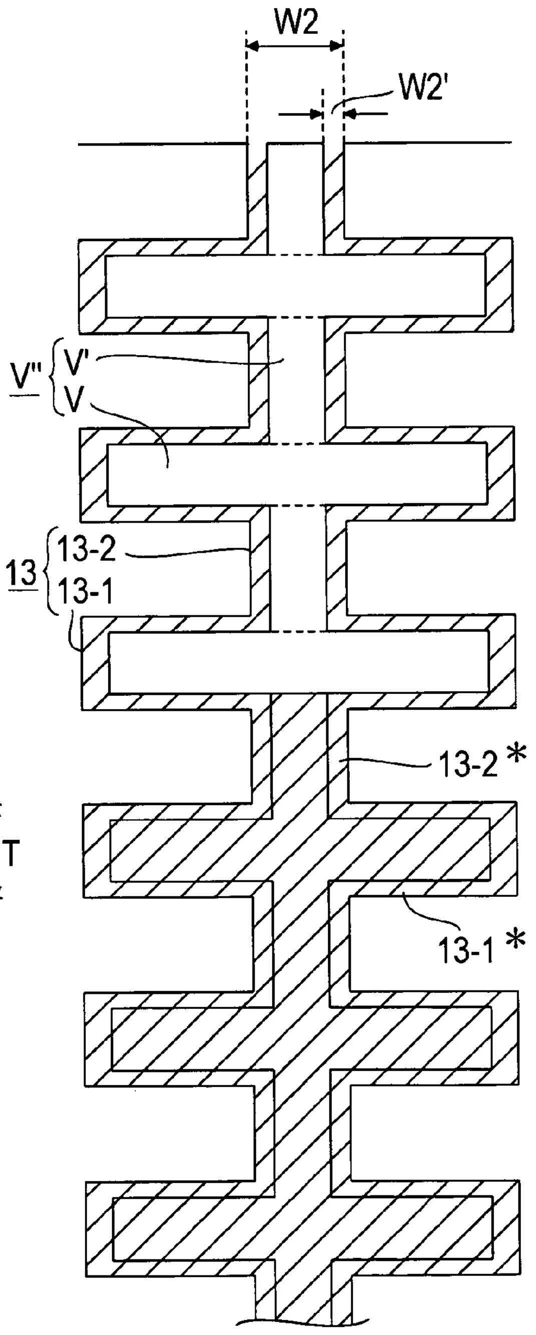
FIG. 24B is a view showing a further modified form of the signal conductor of FIG. 24A.

As in the embodiment 18 illustrated in FIG. 24A, a modified configuration is also possible. In this configuration, all of the first conductor lines and the second conductor line sections are formed with such conductor film-devoid areas V or V', respectively and those conductor film-devoid areas V and V' are joined together so as to form a single joined conductor film-devoid area V". Or still alternatively, as illustrated in FIG. 24B, a further modified configuration is also possible. In this configuration, one or some of the first conductor lines and one or some sections of the second conductor line are formed with such conductor film-devoid areas V or V', respectively and those conductor film-devoid areas are joined together to form a single joined conductor film-devoid area V" while the remaining conductor lines 13-1* and the remaining sections 13-2* of the second conductor line do not have such areas.

It should be understood that the construction as illustrated in FIG. 22 and 23 in which conductor film-devoid areas are provided in the first and/or second conductor lines is applicable not only to the signal conductor of FIG. 3, but also to the signal conductors shown in FIGS. 5 et seq, so that they are applicable to variable resonators and variable phase shifters.

What is claimed is:

1. A variable resonator which comprises a ground conductor, a dielectric, a signal conductor resonates to an electric signal at a particular high-frequency, and at least one switch, wherein:

said signal conductor comprises one or a plurality of first conductor lines spaced apart by a predetermined distance from each other and a second conductor line connected with said one first conductor line or all of said first conductor lines;

said first conductor line or lines has or have a width different from that of said second conductor line whereby a signal path through which the high-frequency electric signal passes and which is longer than the line length of the second conductor line is defined;

one terminal or terminals of said switch or switches is or are connected with said first conductor line or lines while the other terminal or terminals of the switch or switches is or are connected with said second conductor line, or, alternatively both terminals of said switch or switches being connected with a plurality of said first conductor lines, whereby selectively opening and closing said switch or switches will electrically disconnect and connect between the corresponding conductor lines with which the both terminals of said switch or switches are connected, to thereby vary the length of the signal path and thus vary the resonant frequency.

2. The variable resonator set forth in claim 1 further comprising a grounding switch applied to electrically connect and disconnect one of said first conductor lines with said ground conductor.

3. The variable resonator set forth in claim 1 or 2, wherein the length of each of said first conductor lines is less than a quarter of the wavelength of the resonant frequency and greater than the skin depth of signals at or in the neighborhood of the resonant frequency.

4. The variable resonator set forth in claim 1, wherein at least one of said first conductor line or lines and said second conductor line has a conductor film-devoid area therein whereby the current density flowing in the remaining frame portion of said signal conductor is enhanced.

5. The variable resonator set forth in claim 4, wherein the film-devoid area of at least one of said first conductor lines and the film-devoid area of said second conductor line adjacent each other are joined together.

6. The variable resonator set forth in claim 1, wherein the both terminals of said switch or switches are connected between the ends of the plurality of first conductor lines.

7. A variable phase shifter which comprises a ground conductor, a dielectric, a signal conductor, and at least one switch, wherein:

said signal conductor comprises one or a plurality of first conductor lines spaced apart by a predetermined distance from each other and a second conductor line connected with said one first conductor line or all of said first conductor lines;

said first conductor line or lines has or have a width different from that of said second conductor line whereby a signal path through which high-frequency electric signal passes and which is longer than the line length of the second conductor line is defined;

one terminal or terminals of said switch or switches is or are connected with said first conductor line or lines while the other terminal or terminals of the switch or switches is or are connected with said second conductor line, or, alternatively both terminals of said switch or switches are connected with a plurality of said first conductor lines, whereby selectively opening and closing said switch or switches will electrically disconnect and connect between the corresponding conductor lines with which the both terminals of said switch or switches are connected, to thereby vary the length of the signal path and thus vary the phase of an input signal and hence the phase difference between the input and output signals.

8. The variable phase shifter set forth in claim 7, wherein the length of each of said first conductor lines is less than a quarter of the wavelength of the input signal and greater than the skin depth of signals at or in the neighborhood of the frequency of the input signal.

9. The variable phase shifter set forth in claim 7, wherein at least one of said first conductor lines and said second conductor line has a conductor film-devoid area therein whereby the current density in the remaining frame portion of said signal conductor is enhanced.

10. The variable phase shifter set forth in claim 9, wherein the film-devoid areas of at least one of said first conductor lines and the film-devoid area of said second conductor line adjacent each other are joined together.

11. The variable phase shifter set forth in claim 7, wherein the both terminals of said switch or switches are connected between the ends of the plurality of first conductor lines.

* * * * *